United States Patent
Schnizler et al.

(10) Patent No.: US 9,413,497 B2
(45) Date of Patent: Aug. 9, 2016

(54) BIT ERROR PATTERN ANALYZER AND METHOD

(71) Applicant: JDSU Deutschland GMBH, Eningen (DE)

(72) Inventors: Reiner Schnizler, Beuren (DE); Paul Brooks, Ofterdingen (DE)

(73) Assignee: VIAVI SOLUTIONS DEUTSCHLAND GMBH (DE)

(*) Notice: Subject to any disclaimer, the term of this patent is extended or adjusted under 35 U.S.C. 154(b) by 165 days.

(21) Appl. No.: 14/201,559

(22) Filed: Mar. 7, 2014

(65) Prior Publication Data

US 2014/0258795 A1  Sep. 11, 2014

Related U.S. Application Data

(60) Provisional application No. 61/774,427, filed on Mar. 7, 2013.

(51) Int. Cl.
| | |
|---|---|
| H04L 1/24 | (2006.01) |
| H04L 25/06 | (2006.01) |
| H04L 1/20 | (2006.01) |
| G06F 7/58 | (2006.01) |
| G01R 31/28 | (2006.01) |

(52) U.S. Cl.
CPC ........ H04L 1/241 (2013.01); H04L 1/20 (2013.01); H04L 25/064 (2013.01); G01R 31/2822 (2013.01); G01R 31/2839 (2013.01); G06F 7/58 (2013.01)

(58) Field of Classification Search
CPC .......... H04L 1/241; H04L 1/20; H04L 1/244; H04L 25/064; G01R 31/2822; G01R 31/2839; G01R 31/318385; G06F 7/58; G06F 7/582

USPC .................. 714/705, 712, 728, 739
See application file for complete search history.

(56) References Cited

U.S. PATENT DOCUMENTS

| | | | |
|---|---|---|---|
| 5,068,879 A | 11/1991 | Woodroffe | 375/367 |
| 5,282,211 A | 1/1994 | Manlick et al. | 714/707 |
| 5,761,216 A * | 6/1998 | Sotome | G01R 31/31813 714/738 |
| 6,424,628 B1 | 7/2002 | Johnstone et al. | 370/241 |
| 6,684,351 B1 * | 1/2004 | Bendak | H04L 1/243 714/715 |
| 7,412,640 B2 | 8/2008 | Kapur et al. | 714/742 |
| 2003/0063566 A1 * | 4/2003 | Abramovitch | H04L 1/242 370/241 |
| 2003/0117960 A1 * | 6/2003 | Quinlan | H04L 1/244 370/241 |
| 2004/0123199 A1 * | 6/2004 | Tan | H04L 1/0061 714/728 |

(Continued)

OTHER PUBLICATIONS

Pete Anslow, CEI Short Stress Patterns White Paper, Optical Internetworking Forum, Nov. 12, 2010, http://www.oiforum.com/public/documents/OIF_WP_CEI_Short_Stress_Patterns.pdf.

*Primary Examiner* — Albert Decady
*Assistant Examiner* — Osman M Alshack
(74) *Attorney, Agent, or Firm* — Mannava & Kang, P.C.

(57) ABSTRACT

The invention relates to a method and device for testing a data link. A single-lane or multi-lane bit error tester that transmits one or more PRBS signals through the data link is augmented with a raw bit error buffer for storing bit error information for each detected error event and an error pattern analyzer. Most frequently occurring intra-lane bit error patterns, inter-lane word error patterns, and bit slip patterns are identified and their characteristics are analyzed so as to provide information indicative of root causes of the detected bit errors and bit slips.

19 Claims, 20 Drawing Sheets

(56) References Cited

U.S. PATENT DOCUMENTS

| | | | |
|---|---|---|---|
| 2005/0071399 A1* | 3/2005 | Bonaccio | G01R 31/31703 708/250 |
| 2006/0133468 A1* | 6/2006 | Chen | H04B 17/0085 375/224 |
| 2006/0143549 A1* | 6/2006 | Yasumoto | H04L 1/244 714/704 |
| 2009/0034597 A1* | 2/2009 | Kobayashi | H04N 17/04 375/224 |
| 2011/0050705 A1* | 3/2011 | Wada | G01R 31/3171 345/440.2 |
| 2012/0063773 A1* | 3/2012 | Sluz | H04B 10/1121 398/27 |
| 2012/0166896 A1* | 6/2012 | Oh | G09G 5/008 714/705 |

\* cited by examiner

BIT ERROR PATTERN ANALYZER AND METHOD

CROSS-REFERENCE TO RELATED APPLICATIONS

The present invention claims priority from U.S. Patent Application No. 61/774,427 filed Mar. 7, 2013, which is incorporated herein by reference.

TECHNICAL FIELD

The present invention generally relates to devices and methods for digital communication testing, and more particularly relates to a method and device for detecting and analyzing bit error and bit slip error patterns for high speed serial and parallel data links.

BACKGROUND OF THE INVENTION

High speed serial single- and multi-lane data links and associated devices often introduce distortion in digital signals, which may result in bit errors and bit slip errors in a digital receiver. Examples of such data links that can cause bit errors are links within components, such as for example a 28 Gbit/s quad retimer, between components on a PCB, such as for example an electrical CAUI-4 interface used for 100 Gbit/s transponders, board-to-board links within a system, such as for example electrical backplane links, or system-to-system links, such as for example an optical 100 Gbit/s Ethernet 100 GBASE-LR4 link. Diagnosing and analyzing root causes of such bit errors and bit slips occurring on high speed data links is often difficult and time consuming. The problem is often exacerbated when the errors occur infrequently, for example once a day.

A conventional method of diagnosing such problems is to tap the signal and to analyze it with a high speed Digital Sampling Oscilloscope (DSO) or other suitable analyzer tools. However, tapping of high speed signals is often not possible, for example when the error occurs within a component or a closed subsystem, or because tapping severely distorts the signal. On multi-lane links a necessity to tap multiple signals in parallel might exacerbate the difficulties. In addition, the signals are often severely distorted and judgment of the signal quality may not be possible without complex pre-processing, for example by means of an equalizer. Even if such preprocessing is available, it is often not possible or at least difficult to deduce which portion of the signal causes bit errors at the receiver. Furthermore, DSOs or similar test equipment with a high enough measurement bandwidth can be extremely expensive or simply non-existent, such as in the case of very high speed links. As a result, the root causes of bit errors often remain unclear.

Therefore, technicians are often forced to work in the dark when trying to determine and remove root cause of bit errors in a data link. Typically a trial and error approach is used, which includes tuning a number of parameters, such as output level, de-emphasis, equalizer, slicer level, sampler phase, etc., while making bit error rate (BER) measurements for every parameter combination tried. This process is often very time consuming, in part because each BER measurement can take a long time when errors are infrequent, and also because tuning of the various parameters influence the measurement result in a hard to predict and mutually dependent manner.

An object of the present invention is to provide a method and/or device for bit error analysis that correlates bit errors with specific bit patterns and related signal characteristics thereby enabling a quick estimation of likely causes of the bit errors.

SUMMARY OF THE INVENTION

Accordingly, one aspect of the present invention relates to a method of testing a data link that enables a non-intrusive identification of probable causes of bit errors by firstly identifying bit patterns that are likely to cause bit errors and secondly by determining and providing to the user specific signal properties of the bit error patterns that are indicative of the probable causes of the bit errors. The method comprises: a) providing a first pseudo-random bit sequence (PRBS) to the input port of the data link; b) using a first PRBS analyzer connected to the output port of the data link to detect bit error events in a first received bit sequence, wherein the first received bit sequence corresponds to the first PRBS transmitted over the data link; c) for each bit error event detected by the first PRBS analyzer in at least a portion of the first received bit sequence, writing bit error information into an error buffer, wherein the bit error information comprises PRBS analyzer state information corresponding to the detected bit error event; d) using an error pattern analyzer to read the bit error information from the error buffer, to associate detected errors with specific bit patterns, and to generate therefrom error pattern analysis information that is indicative of a cause of the detected bit errors; and, e) providing the error pattern analysis information to a user.

One aspect of the present invention relates to a bit error pattern tester that implements the method of the present invention for testing digital signal transmission through a data link. The bit error pattern tester comprises a PRBS generator for feeding a PRBS signals into an input port of the data link, a PRBS analyzers for detecting bit errors in a received bit sequence, wherein the received bit sequence corresponds to the PRBS signal received from an output port of the data link after transmission over the data link, and an error data buffer. Further provided is an error data generator that is operatively connected to the PRBS analyzer for receiving therefrom bit error information for each detected bit error event, and for writing the bit error information into the error buffer. The bit error pattern tester further comprises an error pattern analyzer that is operatively connected to the error data buffer and is configured to associate detected errors with specific bit patterns based on the bit error information saved in the error data buffer, and to generate bit error pattern analysis information that is indicative of a cause of the detected bit errors; and, an output device for providing the bit error pattern analysis information to the user.

BRIEF DESCRIPTION OF THE DRAWINGS

The invention will be described in greater detail with reference to the accompanying drawings which represent preferred embodiments thereof, in which like elements are indicated with like reference numerals, and wherein.

DETAILED DESCRIPTION

Figure 1:
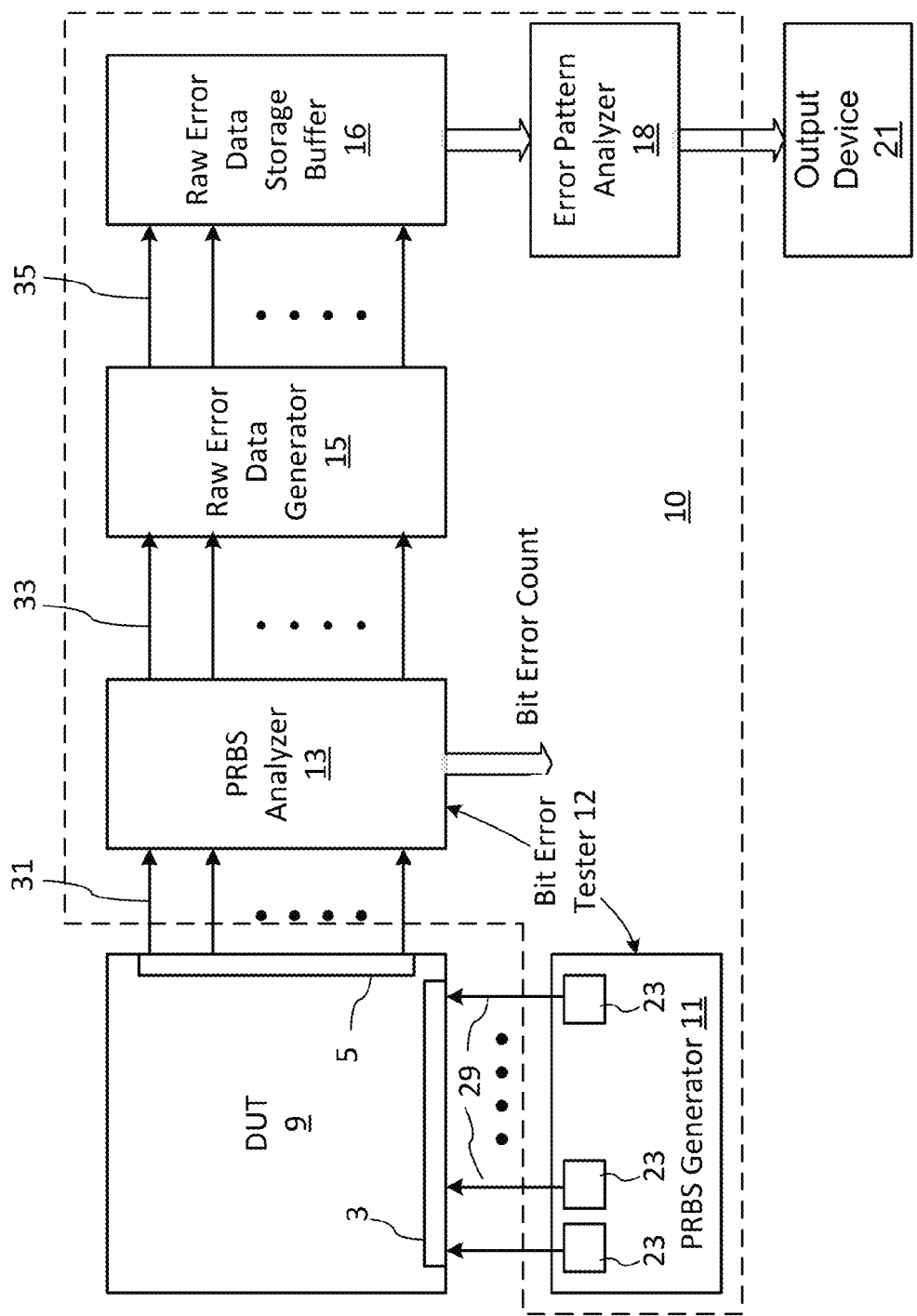
FIG. 1 is a general block diagram of a bit error pattern analyzer.

In the following description, for purposes of explanation and not limitation, specific details are set forth, such as particular circuits, circuit components, techniques, etc. in order to provide a thorough understanding of the present invention. However, it will be apparent to one skilled in the art that the present invention may be practiced in other embodiments that depart from these specific details. In other instances, detailed descriptions of well-known methods, devices, and circuits are omitted so as not to obscure the description of the present invention.

Note that as used herein, the terms "first", "second" and so forth are not intended to imply sequential ordering, but rather are intended to distinguish one element from another unless explicitly stated. The term "data link" as used herein may refer to any transmission-type device, including but not limited to a transmission line, that has an input single-lane or multi-lane port for receiving a stream or streams of binary data, and an output single-lane or multi-lane port for outputting the stream or streams of binary data after its propagation in the device. The terms 'data link' and 'device under test' (DUT) are used herein interchangeably. When a plurality of digital signals are transmitted through a device or data link in parallel, the signal path of each of the digital signals in the device is referred to herein as a lane. When the plurality of parallel digital signals are bit-synchronized, an ordered set of time-synchronous bits from all lanes is referred to herein as an inter-lane word, or simply as word where it cannot lead to a confusion.

One aspect of the present invention relates to an indirect, non-intrusive method of diagnosis and analysis of bit errors and bit slips in high-speed data links, which is based on establishing correlations between bit errors and bit and word patterns present in the link when errors occur. Embodiments of the method use a single or multi-lane bit error rate test set (BERT), which is augmented by an error pattern analyzer. Pseudo random sequences (PRBS) generated by the BERT are used as test signals. With high speed data links, the mechanisms which lead to bit errors or CDR (clock and data recovery) slips are often related to specific data signal pattern carried over the link. Examples of such mechanism are inter-symbol interferences caused by bandwidth limitations, distortions caused by reflections and baseline wander caused by AC coupling. If this is the case, a correlation between the bit pattern sequence and the occurrence of errors exists, and the method disclosed herein enables to establish these correlations. In case of multi-lane links errors may not only be caused by the bit pattern sequence transported over the particular lane in error but may also be caused by the bit pattern sequences transported over the other lanes of the link. In this case a correlation between the word pattern sequence and the occurrence of errors exists. Examples of such mechanism are crosstalk and simultaneous switching noise.

With reference to FIG. 1, there is illustrated a measurement setup wherein a data link 9, which is also referred to herein as DUT 9, is connected to a bit error pattern tester (BEPT) 10. BEPT 10 includes a BERT 12, which can be a commercially available instrument, such as for example a ParBERT 81250 that is available from Agilent Technologies, and which is comprised of a PRBS generator 11 and a PRBS analyzer 13 as known in the art. The PRBS analyzer 13 is operatively followed by a raw error data generator (REDG) 15, which is coupled to a raw error data storage buffer (REDB) 16, which is also referred to herein as an error buffer or a bit error buffer. An error pattern analyzer (EPA) 18 is further provided and is in turn operatively coupled to REDB 16 for accessing bit error data stored therein. An output device 21, such as a computer display, may further be provided for displaying to a user results of the error pattern analysis generated by the EPA 18. Although shown in the figure to be outside of the BEPT 10, in other embodiments the output device 21 may be incorporated in BEPT 10. In one embodiment, the output device 21 may be in the form of a network card, a wireless card, or a suitable adapter for connecting to a remote display or a remote computer. In some embodiments, EPA 18 may also be implemented in a computer device that is separate from BEPT 10, for example in a portable computer, a smart phone or a tablet. In one embodiment, PRBS generator 11, PRBS analyzer 13, REDG 15 and REDSB 16 may all be implemented with a single digital processor, such as an ASIC or an FPGA. The bit error buffer 16 may be implemented using any suitable data storage device including but not limited to RAM, or using FPGA registers.

Figure 2:
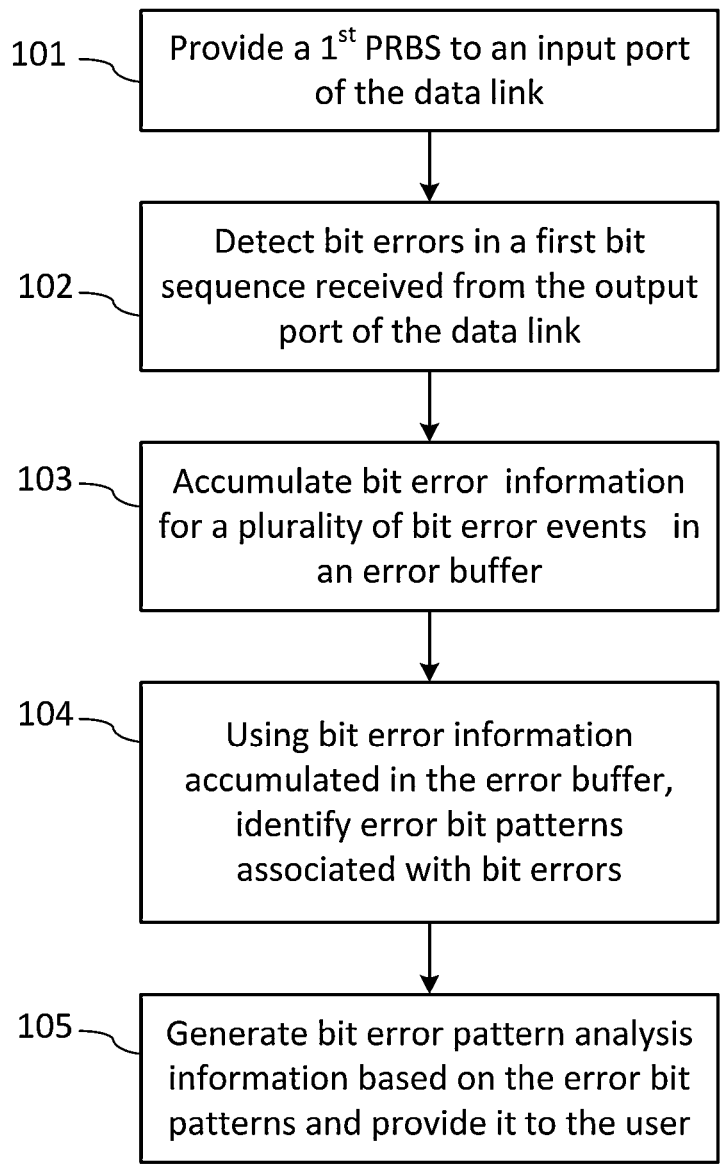
FIG. 2 is a flowchart of the method for bit error pattern identification and analysis.

Turning now to FIG. 2, BEPT 10 is configured for implementing a method of the present invention, which in one embodiment thereof includes the following general steps: At 101, providing a first PRBS 29 to an input port of a data link to be tested, such as DUT 9. At 102, using a PRBS analyzer 130 to detect bit errors in a first bit signal received from the output port of the data link, wherein the first bit signal corresponds to the first PRBS modified by the transmission through the data link. At 103, for each bit error event detected by the PRBS analyzer in at least a portion of the first received bit sequence, writing bit error information into an error buffer 160, accumulating therein the bit error information for a plurality of bit error events; the bit error information may include PRBS analyzer state information corresponding to the detected bit error event. At 104, using the bit error information accumulated in the error buffer, identify error bit patterns that are likely to be associated with bit errors. At 105, generating error pattern analysis information based on the identified error bit patterns and providing it to the user.

As illustrated in FIG. 1, both BEPT 10 and DUT 9 are multi-lane devices, with DUT 9 having a multi-lane input port 3 for receiving an input data stream of up to L parallel sequences of binary, or in more general case digital data, and a multi-lane output port 5 for outputting the output data stream comprised of the L parallel sequences of digital data after it propagated through DUT 9, wherein L is an integer greater than 1. In other embodiment, BEPT 10 may be a single-lane devices, so that L=1. In one embodiment of the method, the multi-lane PRBS generator 11 includes L independent single-lane PRBS generators 23 that may be seeded with different seeds but are however synchronized to a same clock. In operation the single-lane PRBS generators 23 generate L parallel and synchronous PRBSs 29, which are provided to the input port 3 of DUT 9 over the L parallel lanes and are then transmitted through DUT 9 to the output port 5, from which they are received by the PRBS analyzer 13 in the form of received PRBS signals 31. DUT 9 introduces a degree of signal distortion into the input PRBSs 29, so that the received signals 31 may deviate in shape of their waveform from the corresponding PRBSs 29. The multi-lane PRBS analyzer 13 correlates each of the received signals 31 with delayed copies of respective PRBSs 29 to identify bit errors.

Every time a bit error occurs on any lane, information related to the bit error is generated by the raw error data generator 15 and is written to the error buffer 16. In one embodiment, the data stored in the error buffer 16 contain PRBS analyzer state information as well as additional information. From the data stored in the buffer 16, EPA 18 is able to reconstruct all intra-lane error bit patterns and inter-lane error word patterns as well as their exact location on the time line. From this reconstructed patterns and their location on the time line EPA 18 is able to calculate further error pattern analysis information such as transition density wander, baseline wander, neighbor lane activity etc, which is indicative of a cause of the detected bit errors. The data storage buffer 16 may be sized to store a high number of errors, possibly occurring over a long period of time. In one embodiment, EPA 18 is configured, for example programmed to execute a suitable algorithm, to distinguish between bit errors and bit slips. As a result of the analysis process executed by EPA 18, a large amount of information may be provided to the user. This information enables the user to deduce likely root cause for errors in DUT 9, and decide which modifications of DUT 9 or of in parameter settings are required to eliminate the cause of the errors.

Figure 3:
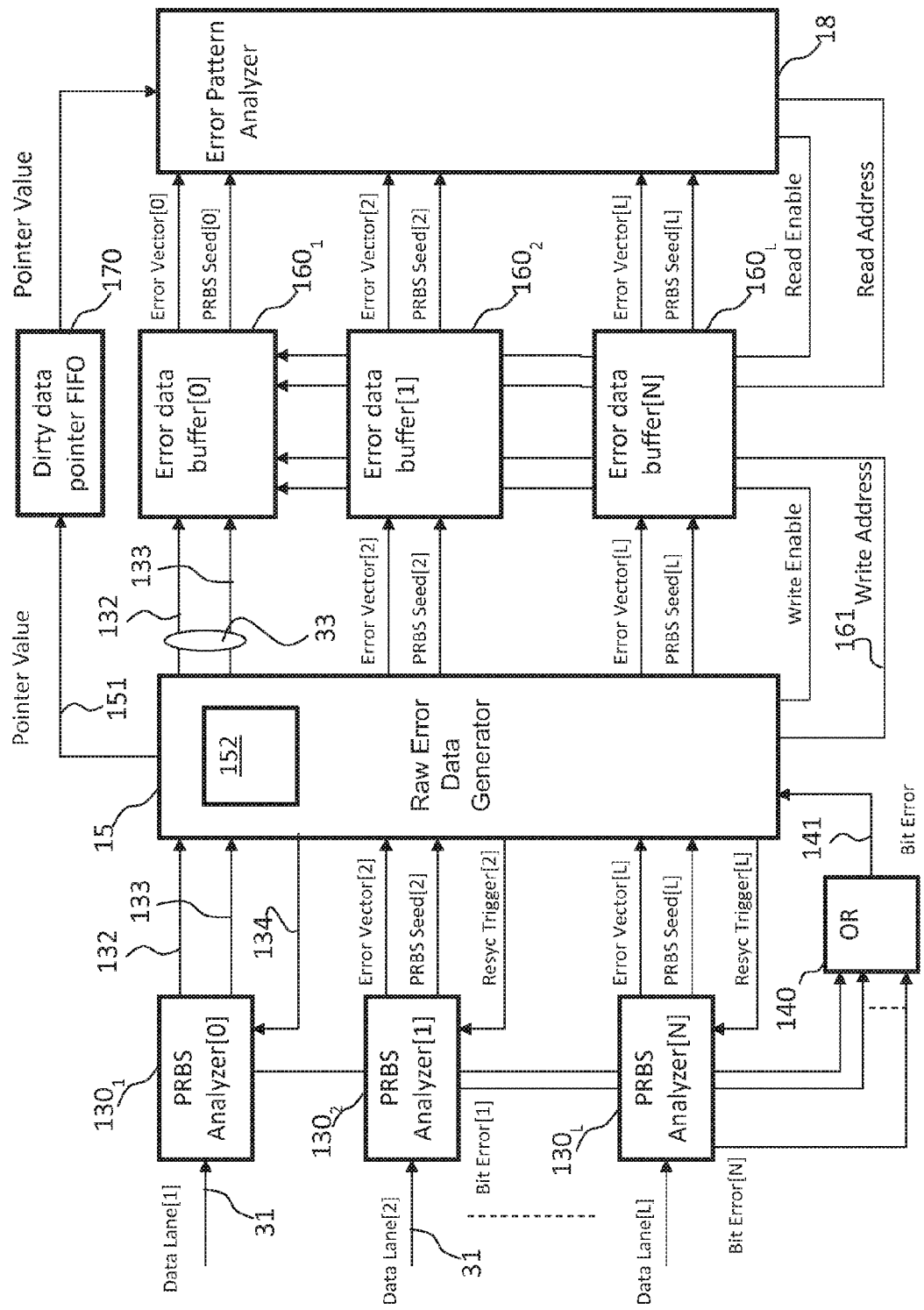
FIG. 3 is a block diagram of an embodiment of the bit error pattern analyzer of FIG. 1.

Referring now to FIG. 3, there is illustrated the data receiving and analyzing portion of BEPT 10 in one embodiment thereof. In one embodiment of the method, the L PRBS signals 31 from the output port 5 of DUT 9 are received along L data lanes by L single-lane PRBS bit error analyzers $130_1$ to $130_N$, which together form the multi-lane PRBS analyzer 13 of FIG. 1. The single-lane PRBS bit error analyzers $130_i$, i=1, ..., L, may be all substantially identical and are referred to herein generally as PRBS analyzers 130. The PRBS analyzers 130 correspond to the single-lane PRBS generators 23, are independent but are clocked with the same clock. Therefore, all PRBS analyzers 130 generate clock synchronous output information.

Figure 4:
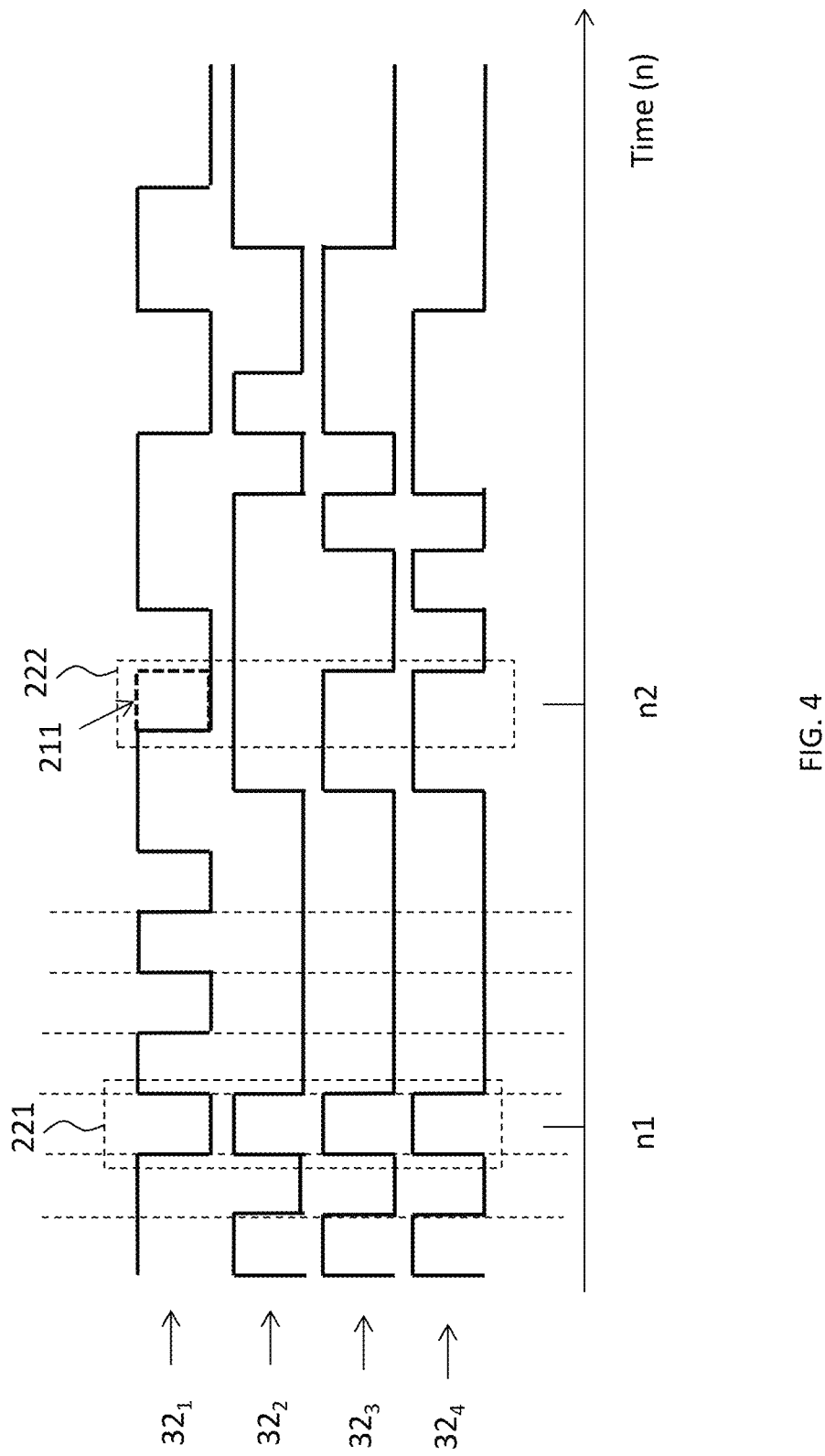
FIG. 4 is a diagram illustrating synchronous multi-lane bit sequences at the output of PRBS analyzers.

The PRBS analyzers 130 make bit decisions on the PRBS signals 31 received from the DUT 9, thereby transforming the received signals into synchronous bit sequence $32_i$, i=1, ..., L, which are illustrated in FIG. 4 for an exemplary case of L=4, and which are generally referred to herein as the received bit sequences 32. The PRBS analyzers 130 detect bit errors in the received bit sequences 32 as known in the art by comparing each received bit sequence 32 to a corresponding PRBS 29 or a copy thereof. In FIG. 4, a first received bit sequence $32_1$ is shown to have a bit error 211 at bit position $n_2$. An ordered set of L time-synchronous bits, one from each received bit sequence, is referred to herein as an inter-lane word. In FIG. 3, an inter-lane word 221 [0 1 1 1] at a timeline bit position $n_1$ is error-free while an inter-lane word 222 [0 1 1 1] has a bit error at the first bit position in the word corresponding to the first lane i=1.

Referring back to FIG. 3, each PRBS analyzer 130 forwards bit error information 33 for each error event it encounters to the raw error data generator 15, which saves this information in one of error data buffers 160 1-160 L associated therewith. The L bit error data buffers 160 $i$, which together embody REDB 16 of FIG. 1, are individually assigned to PRBS analyzers 130 $i$ to store error information generated by each specific PRBS analyzer 130 in a logically separate buffer. In one embodiment, the bit error information 33 includes PRBS analyzer state information, such as a PRBS word-level seed, corresponding to the bit error detection event. In the illustrated embodiment, the bit error information 33 includes an error vector 132 and the PRBS word level seed information 133.

Figure 5:
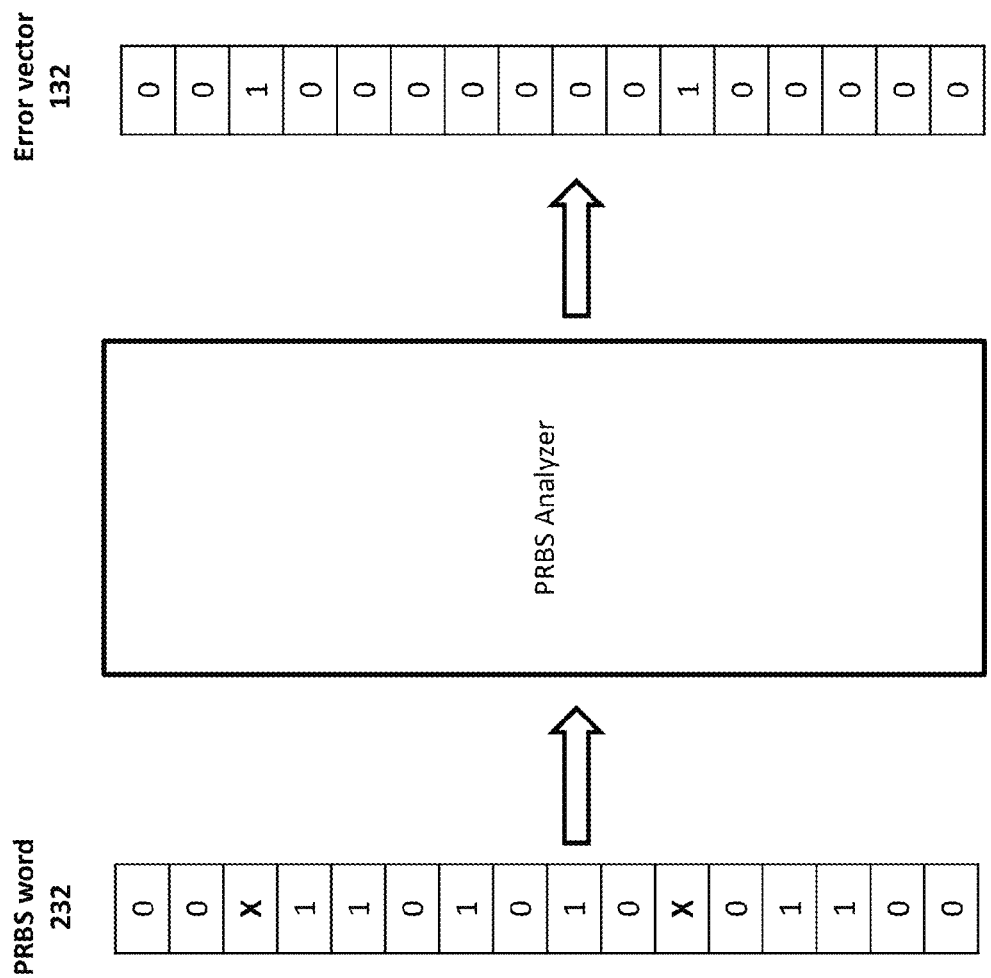
FIG. 5 is a schematic diagram illustrating the formation of an error vector by a PRBS analyzer.

Referring now to FIG. 5, in one embodiment PRBS analyzers 130 implement parallel processing of the incoming PRBS signals 31, wherein a block of consecutive bits thereof, referred to herein as a PRBS word 232, are processed in a single clock cycle. The error vector 132 is a data word indicating which bits of the processed PRBS word 232 are in error. In the illustrated example, PRBS word 232 has two bit error shown with 'x', and the error vector 132 has '1's in the corresponding bit error positions and '0's everywhere else. The positions of bit errors in the PRBS word 232 relative to the first bit of the word are referred to herein as bit error offsets. The width M of the error vector 132 corresponds to the amount of parallelism in the PRBS analyzers, i.e. the number of bits processed per clock cycle. For an analyzer processing M bits every clock cycle error vector width also is M bits. By way of example, an FPGA implementation of the PRBS analyzer 130 with a lane speed of 28 Gbit/s (clock speed ~218 MHz) may have a width M of 128 bits. In FIG. 4, M=16 by way of example only.

In one embodiment, the PRBS seed is the state information of the PRBS analyzer 130. A PRBS seed width K, i.e. the number of bit positions in the PRBS seed, may correspond to the length of the generator polynomial of the PRBS. By way of example, a PRBS with the generator polynomial G(x)=1+x28+x31 has a seed width K equal to 31 bits.

In one embodiment, a bit error signal 131 is generated by each PRBS analyzer 130 and passed onto an error detection element 140. The bit error signal 131 may be a binary signal that indicates whether an error event has been detected ('1') or not ('0') by a particular PRBS analyzer 130 in a current cycle of the PRBS analyzer operation. If at least one PRBS analyzer 130 has detected a bit error in the current clock cycle, the error detection circuit 140 sends an error signal 141 to the REDG 15. In one embodiment, the error detection circuit 140 may implement a logical "OR" on all analyzer bit error signals 131. When the so generated error signal 141 is a logical "true" ('1'), that is at least one of the PRBS analyzer $130_i$ has detected a bit error event, the raw error data generator 15 writes the error vector 132 and PRBS seed data 133 from each PRBS analyzer $130_i$ to an error data buffer $160_i$ associated with the $i^{th}$ data lane.

Figure 6:
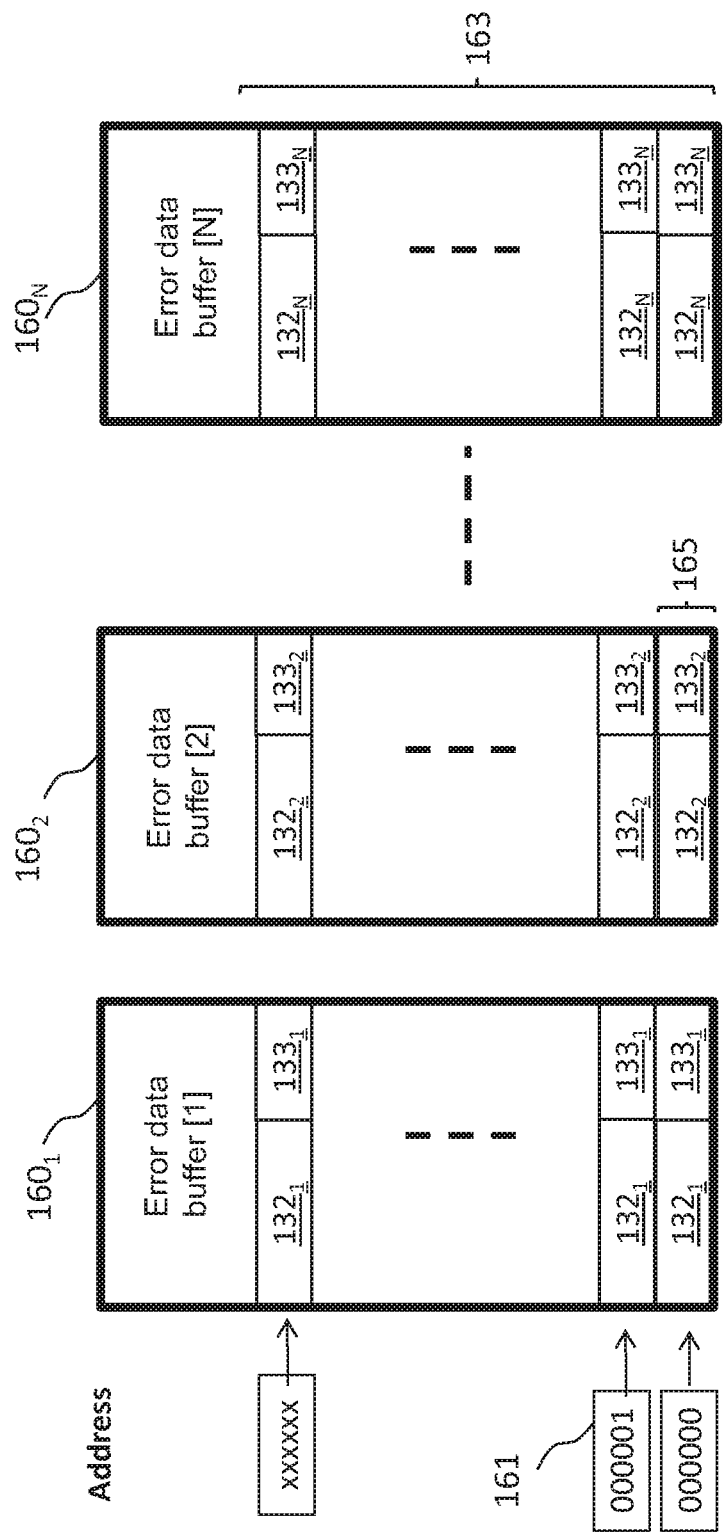
FIG. 6 is a schematic diagram illustrating error data entries saved in the raw error data buffers.

Referring now to FIG. 6, in one embodiment a same write address 161 is used for all error data buffers $160_i$ in the same clock cycle. After the write access, the buffer write address is incremented to prepare for the next set of bit error data 33. When the bit error signal 141 is 'false', that is no bit errors have been detected in any of the lanes, no data is written to the error data buffers 160 and the write address 161 is not incremented. This process generates a list 163 of data entries 165 for every lane in the error data buffers 160. In one embodiment every data entry 165 comprises an error vector $132_i$, where i=1, . . . , L indicates a lane, and the associated PRBS seed information $133_i$. Since the process is synchronous and the same write access 161 is used for all buffers $160_i$, it is guaranteed that all buffer entries 165 stored at the same address 161 do correspond to the same time of occurrence across the lanes.

A PRBS analyzer 130 may lose synchronization to the incoming bit pattern due to a bit slip, when a PRBS framer in the PRBS analyzer 'slips' relative to a corresponding PRBS by one or more bits. As a result of a bit slip, the error rate in the error vector 132 becomes typically very high. Accordingly, one embodiment of the invention implements a special bit slip handling process. This process may include detecting and verifying a bit slip, and a mechanism for limiting the number of data entries 165 written to the buffers 160 in order to not flood the error data buffers 160.

Figure 7:
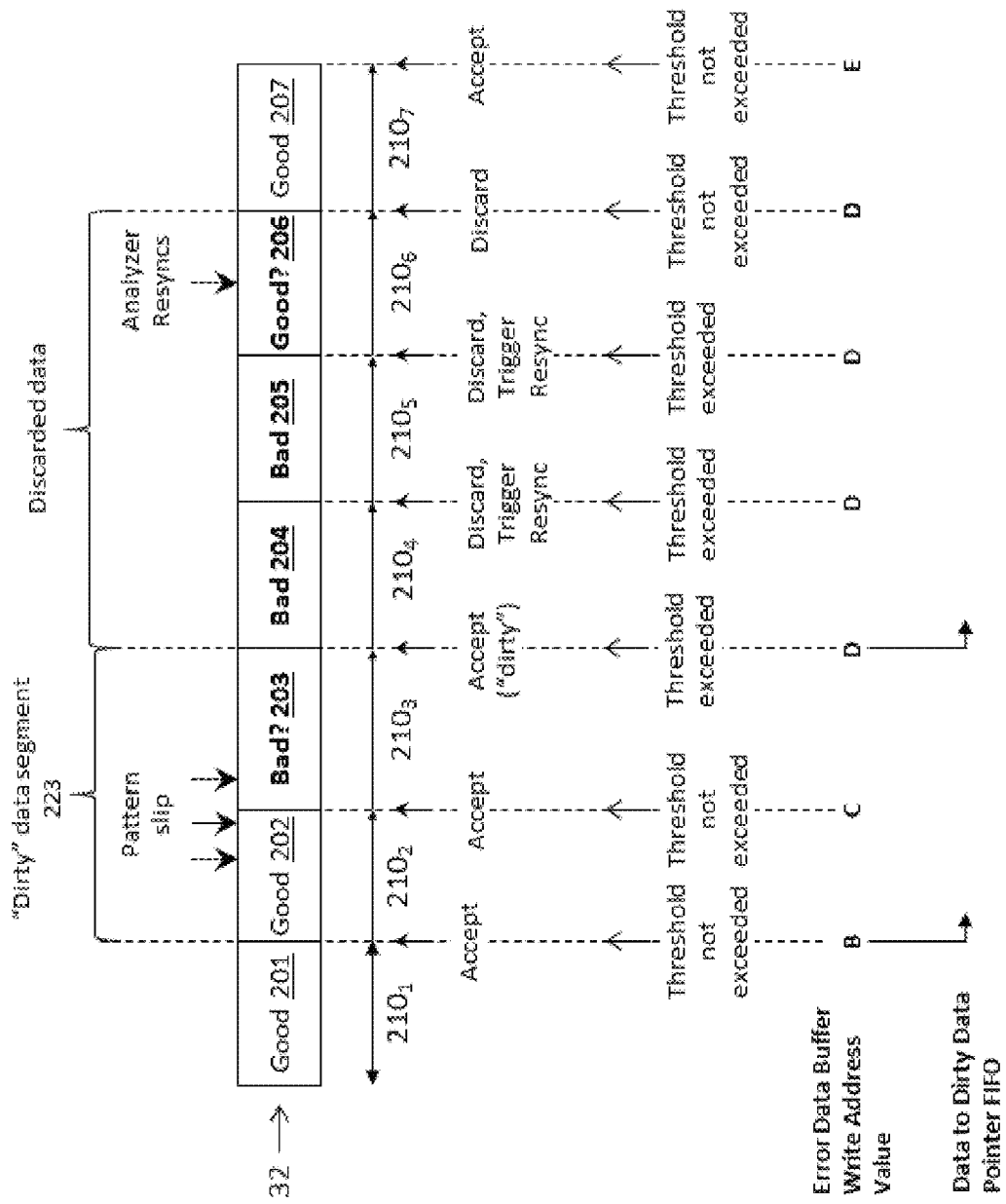
FIG. 7 is schematic diagram illustrating the handling of 'dirty data' with a large error rate due to a bit slip in one embodiment of the invention.

Turning now to FIG. 7 while continuing to refer to FIG. 3, in one embodiment REDG 15 includes an error counter 152, which monitors the rate at which the error data entries are generated. In one embodiment, the error counter 152 counts the number of error entries 165 that are generated for each consecutive interval of the received bit sequence of a predetermined duration. In other embodiments, the number of bit errors may be measured instead. Each of these intervals, which are referred to herein as threshold intervals and are indicated in FIG. 7 with a reference numeral '$210_i$', preferably includes many PRBS words. For example, each threshold interval $210_i$ may be of a 10 ms duration. FIG. 7 illustrates by way of example a length of a received bit sequence 32 including seven consecutive threshold intervals 210 that are labeled '$210_1$' to '$210_7$', with a bit slip happening somewhere at the end of interval $210_2$—beginning of the interval $210_3$, and a re-synchronization of the PRBS analyzer 130 occurring within the interval $210_6$. At the end of each threshold interval $210i$, the error rate detector 152 compares an error rate indicator for the interval to a threshold value. The error indicator may be the number or rate of error events encountered during the ending threshold interval, or the number or rate of the corresponding bit error entries 165 that were generated for the interval, or the bit error rate for the interval. If the error threshold is not exceeded, as for threshold intervals $210_1$ and $210_2$ in FIG. 7 carrying data 201 and 202 labeled as 'good', all the error entries written into the buffers 160 during these intervals are accepted as legitimate. When the error counter 152 encounters a first threshold interval $210_3$ for which the error threshold is exceeded, the data 203 within the threshold interval is identified as "dirty", possibly caused by a bit slip, and writing to the buffers 160 is stopped. In one embodiment, the data 203, 204, Or 205 within the threshold interval is identified as "dirty" when the rate of data entries generated by the REDG 15 within a threshold interval exceeds a pre-defined threshold, for example 0.5 of the clock rate. In one embodiment, a resynchronization trigger signal is also sent to the respective PRBS analyzers 160. This is repeated for each consecutive interval, such as $210_4$ and $210_5$ in FIG. 6, until the error counter 152 encounters a threshold interval $210_6$ with an error data entry rate below the threshold, i.e. until a successful resynchronization to the incoming data. Writing of the bit error information entries 165 into the buffers 160 commences with the threshold interval $210_7$ with 'good' data 207 after the first "good" threshold interval $210_6$.

The error pattern analyzer 18 may require information about the "dirty" error data entries stored in the buffers 160 during the first 'dirty' interval $210_3$. In order to provide this information, in one embodiment the raw error data generator 15 generates a list of dirty data pointers 151. This list is written to a corresponding dirty data pointer FIFO 170. The pointers 151 may be for example in the form of the actual error data buffer addresses 161. In one embodiment, for every 'dirty' segment 223 of the received bit sequence that is saved in the buffer 160, a pair of pointers 151 is written to the FIFO 170, which identify the beginning an the end of the dirty data entries in the buffers 160. In one embodiment, the pair of pointers includes a pointer to the first dirty entry 165 in the error data buffer 160, which in the example of FIG. 6 corresponds to the address of the first error entry made during the threshold interval $210_2$, and a pointer to the first entry 165 after the last 'dirty' entry in the error data buffer 160, which in the example of FIG. 6 corresponds to an address next after the address of the last error entry made during the threshold interval $210_6$.

The error pattern analyzer (EPA) 18 reads the bit error data stored in the error data buffers 160 and, in some embodiments, the 'dirty data' pointers 151 stored in FIFO 170, based on these inputs associates detected bit errors with specific bit patterns, and generates therefrom error pattern analysis information, as described hereinbelow. The error analysis processes implemented in EPA 18 can either run in parallel with the acquisition of the PRBS signals 31, i.e. in online mode, or after the raw data acquisition is stopped, i.e. in an offline mode. EPA 18 may be implemented using software or hardware logic. In one embodiment, EPA 18 is implemented in software, i.e. is in the form of a set of computer executable instructions that are saved in a computer-readable memory and are executed by a digital processor.

The operation of EPA 18 will now be described at first with reference to a first PRBS signal 31 that is received by the first PRBS Analyzer $130_1$ in the first lane, i=1, while the other (L−1) PRBS signals $31_i$, i=2, . . . , L, will be referred to as the second PRBS signals, and the corresponding bit sequences $32_i$, obtained therefrom by the PRBS analyzers 130i, I=2, . . . , L, will be referred to as the second bit sequences. It will be appreciated that the terms 'first' and 'second' do not imply a particular position of the respective lanes relative to other lanes in the multi-lane data link, but are simply labels that are used to distinguish between lanes and signals for the sake of clarity and convenience.

Figure 8:
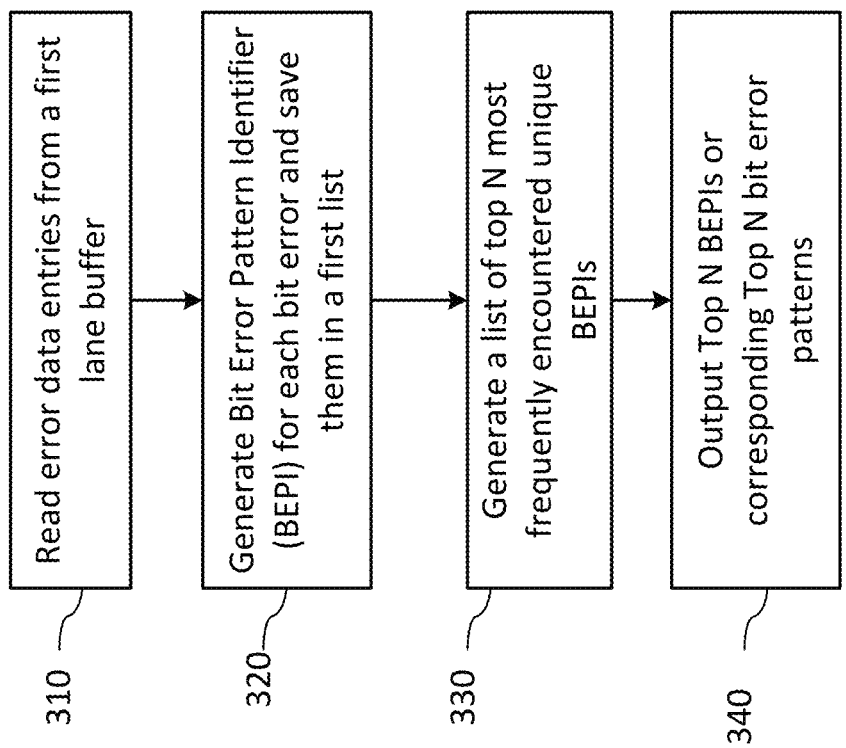
FIG. 8 is a flow chart of a method for identifying correlations between bit patterns and bit errors.

With reference to FIG. 8, in accordance with one aspect of the invention EPA 18 may perform intra-lane bit error pattern analysis, wherein EPA 18 identifies specific bit patterns in the received bit sequence that are more likely than other patterns to be associated with bit errors. In one exemplary embodiment, the intra-lane error pattern analysis starts with step 310 wherein EPA 18 reads the list 163 of bit error entries 165 stored in the first error data buffer $160_1$. At step 320, EPA 18 generates a list of bit error pattern identifiers (BEPI), wherein each bit error pattern identifier uniquely defines an error bit pattern corresponding to a segment of the received bit sequence $32_1$ where the bit error occurred. In this list, some of the bit error pattern identifiers may appear several times. At step 330, a list of top N most frequently encountered bit error pattern identifiers is generated, and then either this list, or a corresponding list of top N most frequently encountered bit error patterns are provided to the user; here N is an integer equal or greater than 1, for example 10, but can also be smaller and greater than 10 and may be user-selectable.

Figure 11:
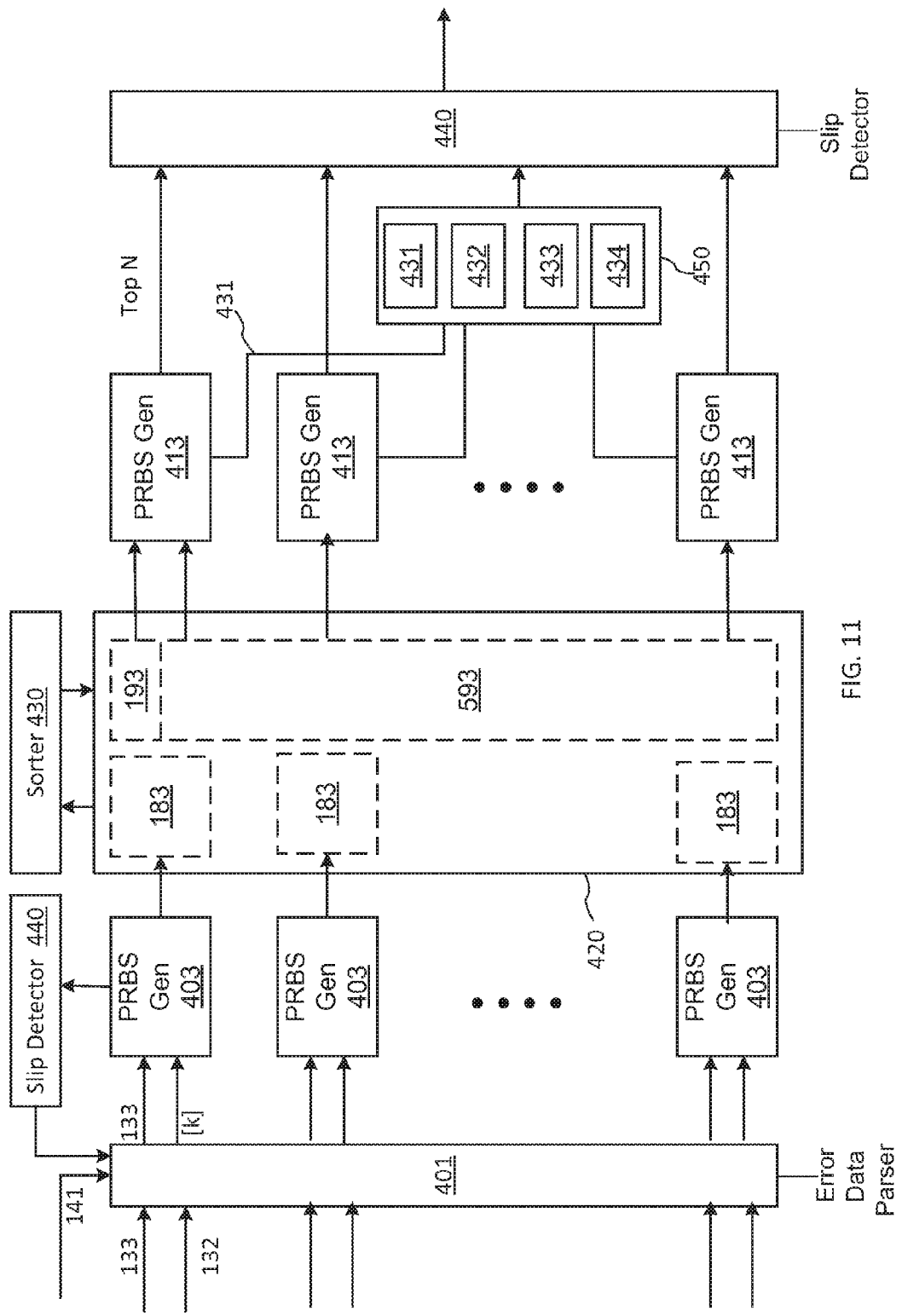
FIG. 11 is a schematic block diagram of a multi-lane error pattern analyzer.

Referring now to FIG. 11, there is illustrated a functional block diagram of EPA 18 in accordance with an embodiment of the present invention. In this embodiment, EPA 18 utilizes as the bit error pattern identifier a bit-level PRBS seed 185 which, when fed to a suitable PRBS generator 413, generates the corresponding error bit pattern wherein the particular bit error occurred. An error data parser 401 reads error data entries 165 from the first buffer $160_1$ and provides to a PRBS generator 403 the PRBS word level seed 133 and the bit error offsets [k] from the error vector 132. Blocks 401, 403, 413, 440, 430, 450 may be implemented using software or hardware logic, while block 420 may be a suitable memory device. When implanted in software, these blocks represent sets of computer executable instructions saved in computer readable memory for executing by a suitable digital processor.

Figure 9:
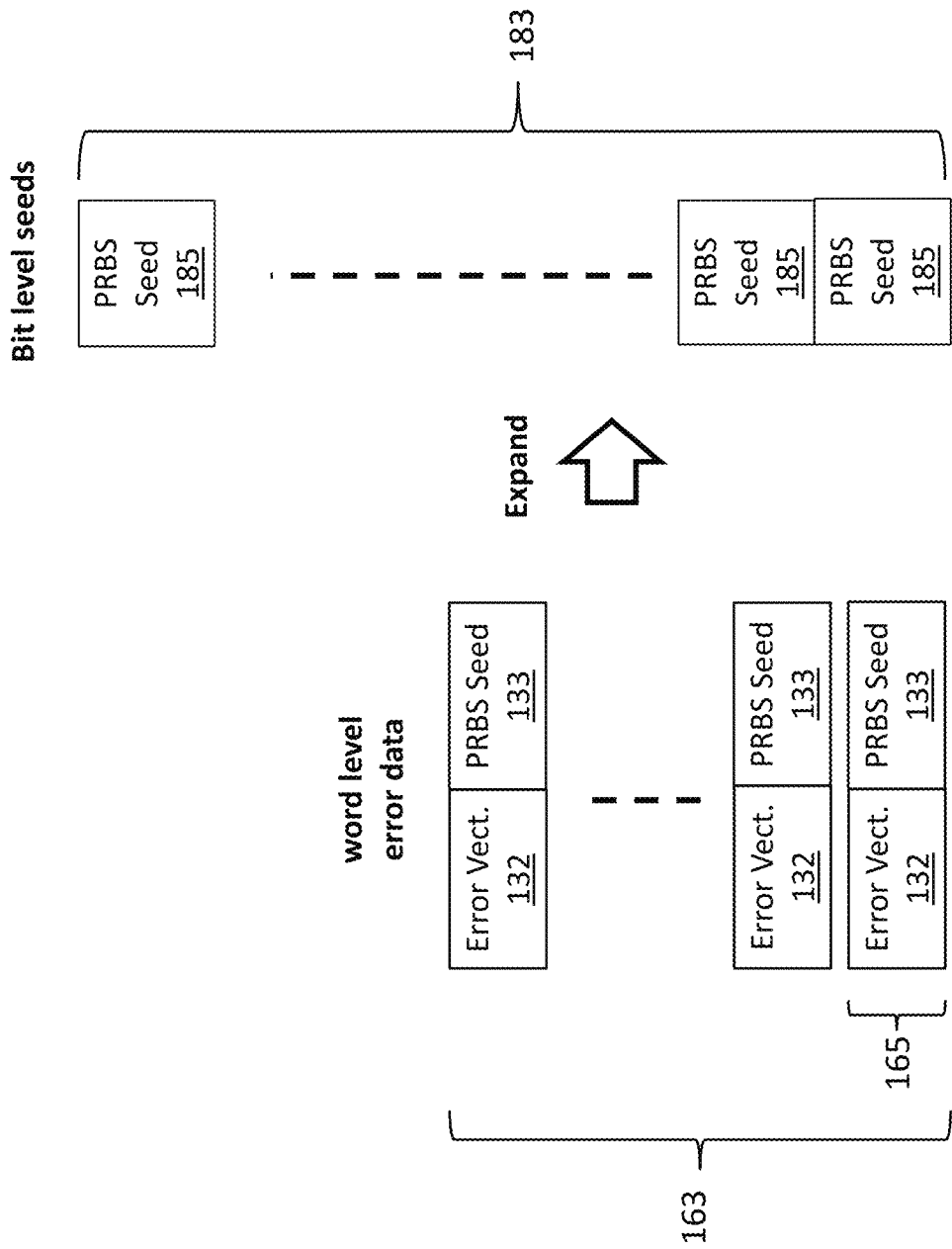
FIG. 9 is a schematic diagram illustrating the generation of a bit-level PRBS seed list from raw error data entries formed of error vectors and PRBS word level seeds.

Turning now also to FIG. 9 while continuing to refer to FIG. 11, from one PRBS word level entry 165, the PRBS generator 403 generates between 1 and m bit level PRBS seeds, depending on the number m of bit errors indicated by the error vector 132. In this embodiment, step 320 of the method of FIG. 8 includes expanding the PRBS word level entries 165 to bit level PRBS seeds 185, thereby creating a bit-level PRBS seeds list 183. Each bit-level PRBS seed 185 corresponds to a single bit error detected in the first received bit sequence $32_1$. The bit level PRBS seeds list 183 is stored in a seed memory 420. The expansion of the PRBS word-level seed 133 into m bit-level PRBS seeds 185 is performed for every bit error indicated by the error vector 132 by loading the simulated PRBS generator 403 with the PRBS word-level seed 133 and shifting it by the number of bits that is equal to the offset k of the bit error within the error vector 132.

Figure 10:
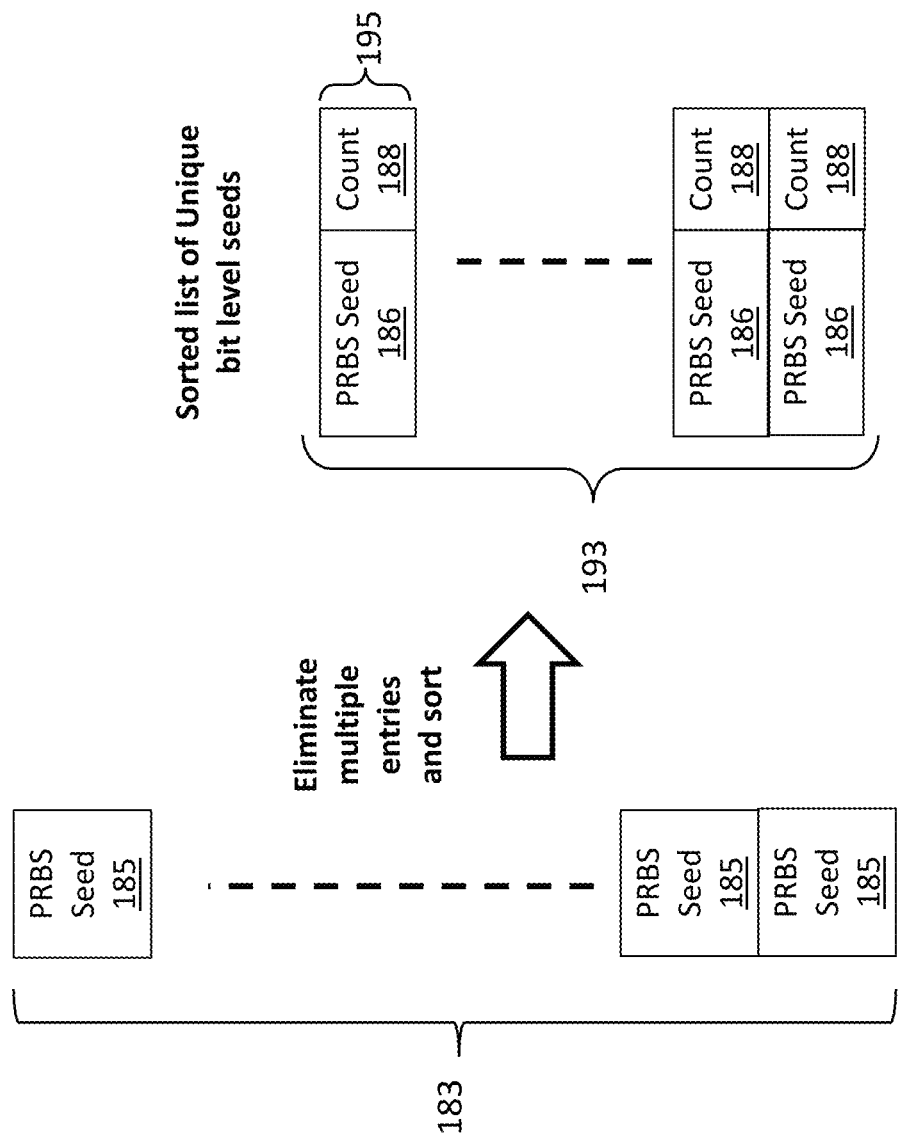
FIG. 10 is a schematic diagram illustrating the generation of an ordered list of unique bit pattern identifiers for most frequently occurring bit error patterns.

Referring again to FIG. 11 and also to FIG. 10, once the bit-level PRBS seeds list 183 is created, a seed counter & sorter module 430 counts all identical entries in the list 183, optionally eliminates double or multiple entries in the list, creates a list of unique bit level seeds 186 wherein each unique seed 186 is assigned a counter 188 indicating the number of occurrences of the seed, and then sorts the seed+counter entries 195 according to the value of the 'counter' 188, for example in a descended order. The resulting sorted bit level seeds list 193, wherein unique bit level seeds 186 are sorted according to the number of occurrences thereof, is then saved in memory 420.

Figure 14:
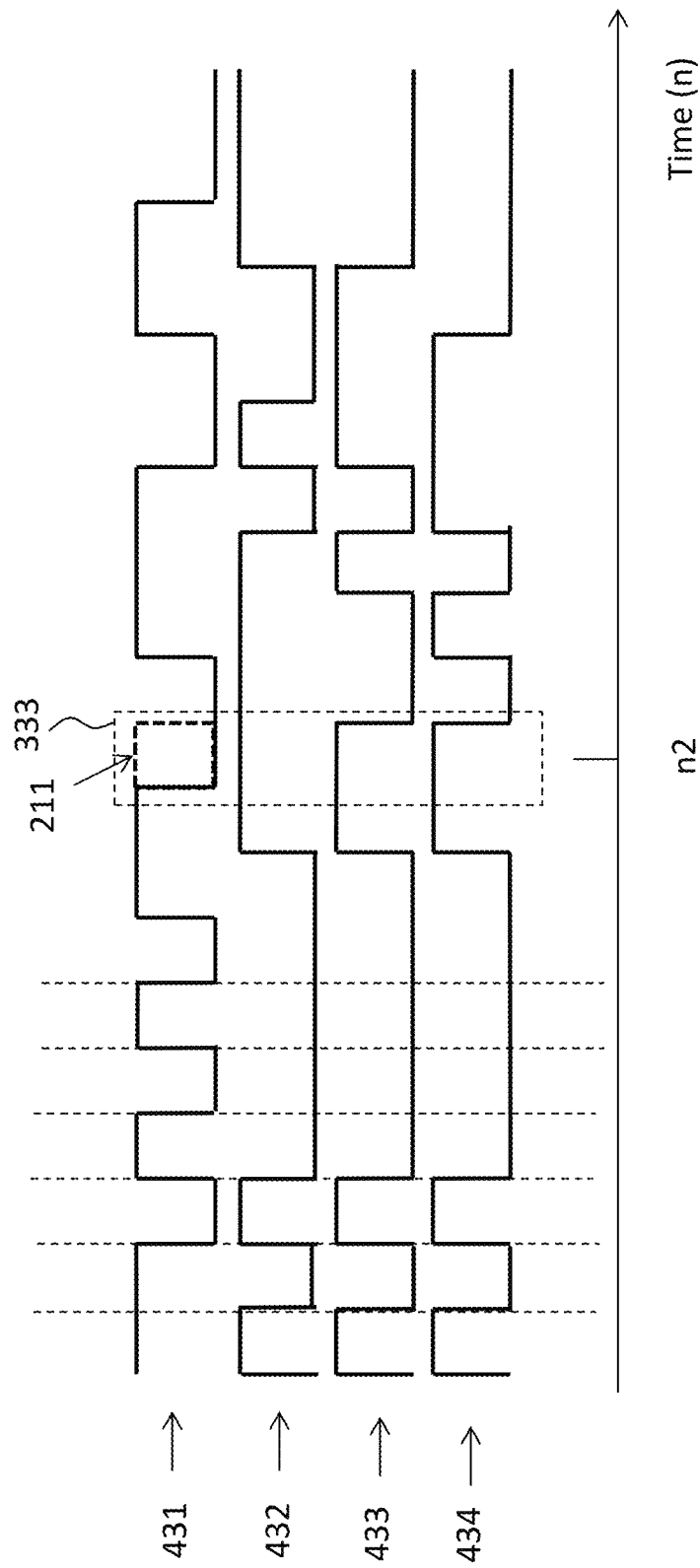
FIG. 14 is a schematic diagram illustrating a word error pattern.

The total count of bit errors detected in the first lane corresponds to the number of entries in the bit level seeds list 183. The total number of different bit error patterns detected corresponds to the number of entries in the unique bit level seeds list 193. A top N bit error patterns correspond to the top N entries in the sorted bit level seeds list 193. The actual bit pattern 431 wherein the bit error occurred is generated by loading a PRBS generator 413 with the corresponding bit level PRBS seed value 185 or 186 and shifting it by a desired number of bits to the left and to the right so as to provide a bit error pattern of a width that is suitable for further analysis by a pattern analysis module 450 and/or as desired for displaying to a user. The resulting bit pattern 431, which corresponds to a segment of the received bit sequence 32 where the bit error occurred, is referred to herein as the bit error pattern 431. By way of example, FIG. 14 illustrates an exemplary bit error pattern 431 of the form [11010101100111001100] having a width of 20 bits with a bit error 211 at a $10^{th}$ bit position. The aforedescribed procedure enables reconstructing of the bit error pattern to any desired pattern length, for example for displaying it as a pseudo waveform to a user using the output device 401.

Figure 12:
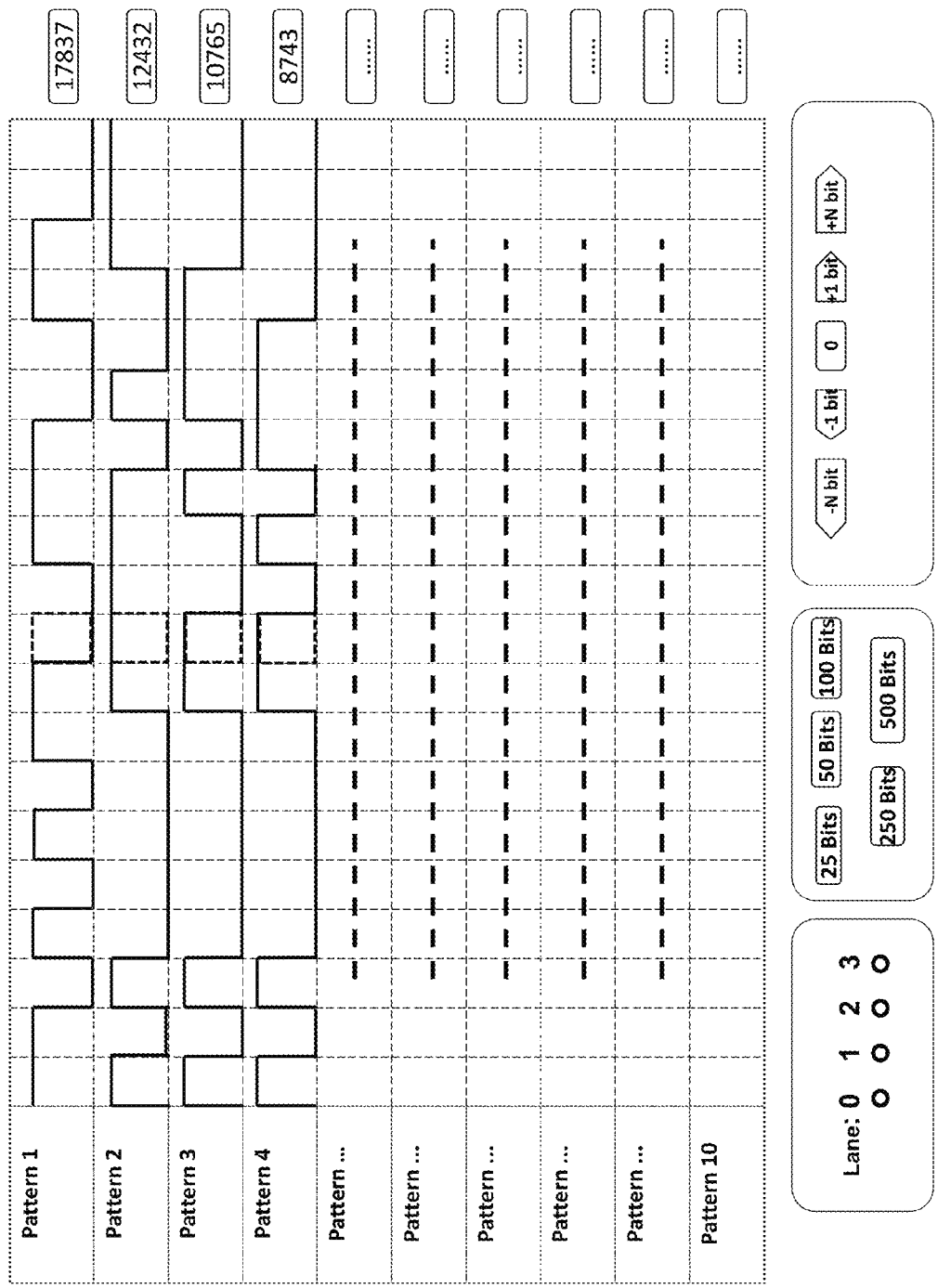
FIG. 12 is an exemplary display view showing top 10 most frequently occurring bit error patterns.

With reference to FIG. 12, in one embodiment a list of top N bit error patterns may be provided to a user, for example using the display 21. As illustrated, the exemplary top-N error bit pattern display shows top 10 bit patterns in which bit errors occur most frequently, and also shows the number of occurrences for each error bit pattern. Additionally, the graphical user interface wherein the top-N bit error patterns are displayed may also provide the user with the ability to change the width of the displayed bit patterns, shift the patterns by one or more bits in any direction, and select for which of the L lanes the bit error patterns are to be displayed.

Word Error Pattern Analysis (Inter-Lane)

In one embodiment, EPA 18 is further configured to perform an inter-lane word error pattern analysis wherein it identifies, in the received parallel multi-lane stream of L bit sequences 32, specific inter-lane word patterns that are more likely than other word patterns to be associated with bit errors. In this mode of operation, EPA 18 operates on error data in all L lanes wherein the parser 401 reads time-synchronous error data entries 165 from all L buffers 160, excluding entries in dirty segments. For each bit error detected in the first bit sequence $32_1$ received in the first lane, a word error pattern identifier is generated. This word error pattern identifier uniquely identifies an inter-lane word that is composed of bits from each of the L bit sequences 32 that are synchronous with the bit error. Similarly to the bit error pattern analysis described hereinabove, top N most frequently occurring word error patterns may be identified and displayed to the user.

Figure 13:
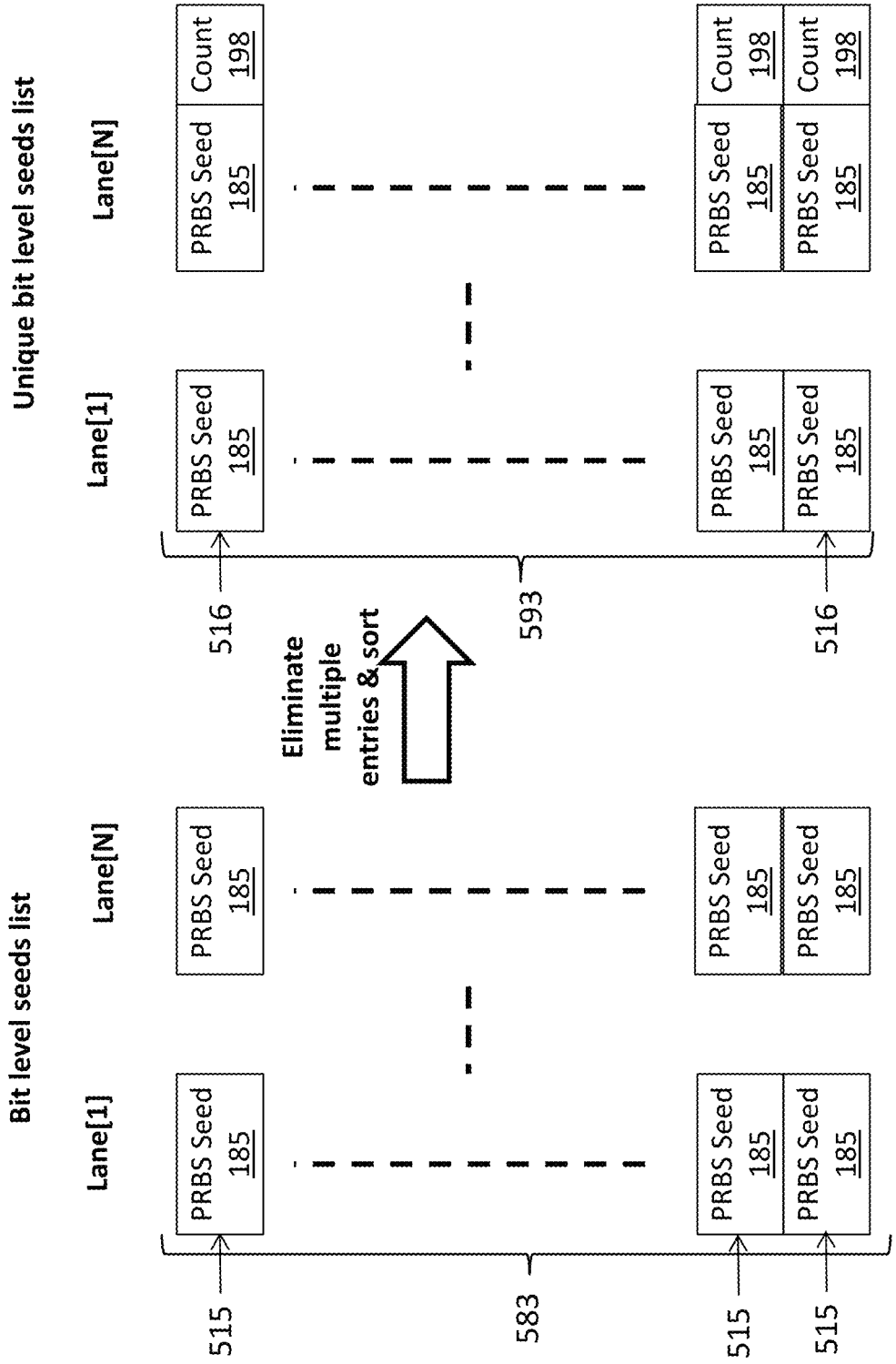
FIG. 13 is a schematic diagram illustrating the generation of a list of unique word error pattern seeds that are ordered according to the frequency of their occurrences.

With reference to FIG. 13, in one embodiment the process of identifying word error patterns is similar to the process of identifying the bit error patterns 431 for the first lane, with the following modifications. Once all L PRBS-word level seeds 133 are read by the parser 401, each of them is expanded by the respective PRBS generators 403 to bit level PRBS seeds 185, one for each bit error in the error vector 132 received in the first lane, by shifting the simulated PRBS generators 403 of all lanes by the same number of bits k as for the first lane analyzed, e.g. i=1. The bit level seed list 183 is extended into a two-dimensional list SEED(i, k) 583 that contains the seeds of the first lane SEED(1,k) and the seeds of all the other (L−1) lanes; here, i=1, . . . , L is a lane index, and k is a bit error offset in the error vector 132 of the first lane that can take m different values, were m is the number of bit errors in the error vector. Two or more different list entries 515 which are identical in the values of all bit-level PRBS seeds 185 for the same lane represent the same error word. An ordered list 515 W(k)={SEED(i, k)}, i=1, . . . , L of all entries that are obtained by shifting one of the PRBS generators 403 by a same offset k represents an inter-lane word.

Similarly to the bit error pattern analysis described hereinabove, the sorter 430 may be configured to identify word error entries 515 that appear multiple times, count the number of occurrences of unique word error entries 516 in the list 583, and order them in accordance with the frequency of their occurrences, for example in a descended order of the word entry count 198. The total count of word errors detected corresponds to the number of entries 515 in the bit level seeds list 583. The total number of different word error patterns detected corresponds to the number of entries in the unique bit level seeds list 593. When the entries 516 are ordered in the descended order of the count 198, the top N word error patterns correspond to the top N entries in the sorted word entries list 593.

The actual word pattern belonging to a set of corresponding seeds 185 is reconstructed by loading the set of L simulated PRBS generators 413 with the corresponding bit level seed values of all lanes as read from a word entry W(k) 515. This process is similar to the bit pattern reconstruction described hereinabove but generates correlated bit patterns for all lanes in parallel, with the bit error in the middle of the first bit pattern provided that the PRBS generators 413 are shifted +/−symmetrically. By way of example, FIG. 14 illustrates bit patterns 431-434 that may be generated in this step for an exemplary case of L=4, with the error bit pattern 431 in the first lane and the bit patterns 432-434 that are time-synchronous with first error bit pattern 431, with the word error pattern 333 of the form [0111] appearing at a time position n2.

The process described hereinabove corresponds to performing, for each error data entry in the buffer 160$_1$ of the first lane, the following sequence of steps:

a) find bit error offsets [k]=$k_1 \ldots k_m$ from the error vector 132 read from the first buffer, b) feed the PRBS generators 403 of all L lanes with the PRBS seeds 133 that are read from their respective buffers 160 at the same error data entry address;

c) shift all L PRBS generators by the same set of bits $k_1 \ldots k_m$ to obtain m rows of L bit-level PRBS seeds SEED(i, $k_j$) ... SEED(i, $k_j$), i=1, ..., L, j=1, ..., m. The L bit-level PRBS seeds SEED(i, k) that are obtained by shifting respective PRBS generators 403 by the same number of bits for example $k_1$, correspond to the same word, and may be written in the same row of the list 593;

The aforedescribed procedure identifies all word patterns having an error at the bit position corresponding to the first lane. In one embodiment, steps (a)-(c) may be repeated for any new bit error positions $l_1 \ldots l_m$ from the error vectors 132 that are read from the time-synchronous data entries 156 in the buffers 160 of all other lanes.

In one embodiment, the parser 401 may be configured to read all time-synchronous entries from the buffers 160, identify bit error offsets k in each of the L error vectors 132 and compose a list [k] of all bit offsets k that are encountered at least once in the L time-synchronous error vectors, and then perform steps (b) and (c) for each offset from the list [k]. The resulting M rows of L bit-level PRBS seeds {SEED(i, $k_j$) ... SEED(i, $k_j$)}, i=1, ..., N, j=1, ..., M define all word errors encountered in a particular clock cycle of the PRBS analyzers 130.

Figure 15:
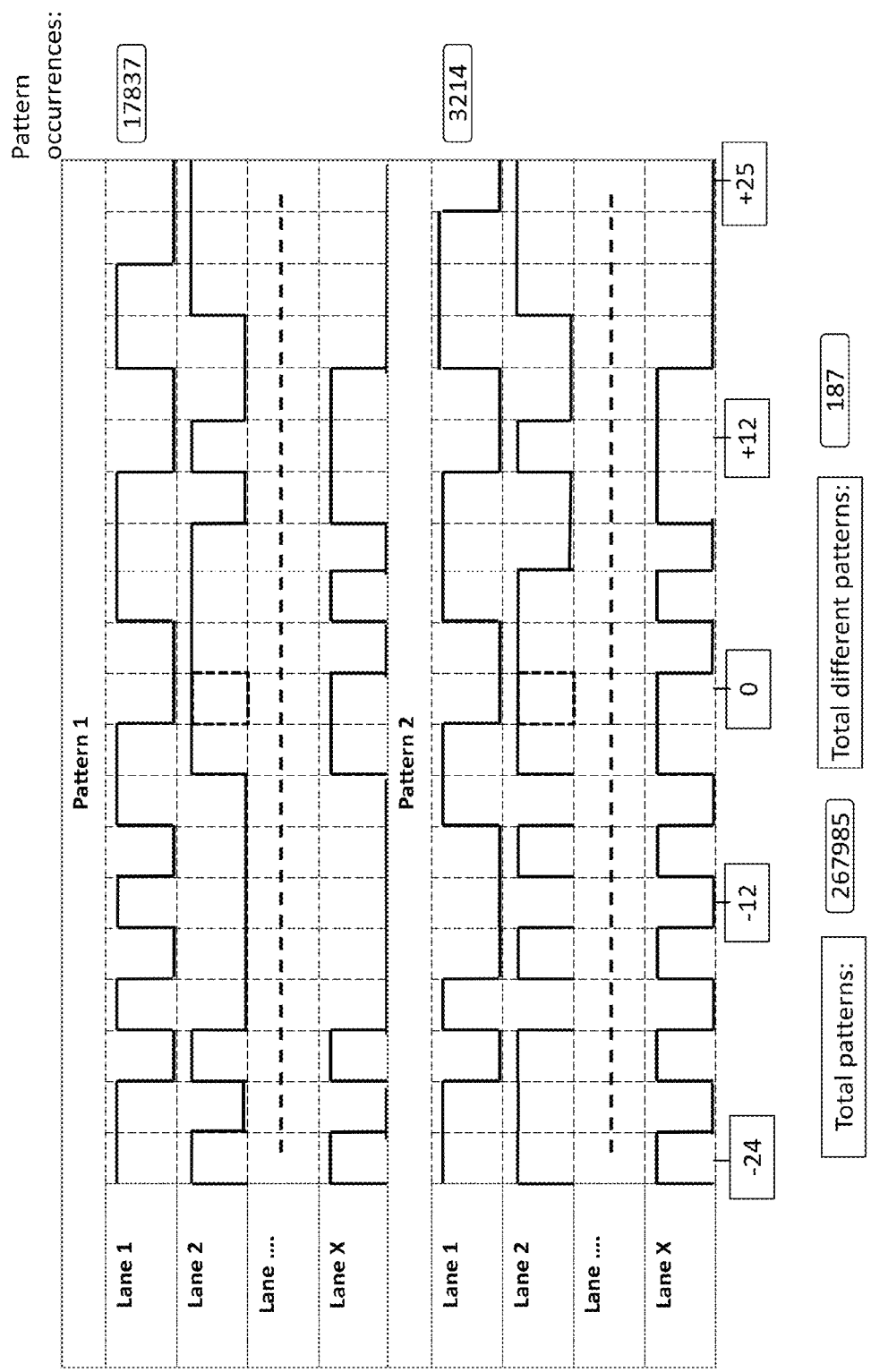
FIG. 15 is an exemplary display view showing top 2 most frequently occurring word error patterns.

In one embodiment, EPA 18 may be configured to display top N most frequently occurring word error patterns to a user. FIG. 15 shows by way of example a display of top two most frequently occurred word error patterns, with bit errors occurring in both patterns in lane 2 at a zero bit position on the display.

Bit Slip Analysis

In one embodiment, EPA 18 further includes a bit slip detector functionality that is configured to analyze the 'dirty data' segment 223 saved in the buffer 160 in order to check for bit slips and to find the bit slip pattern, i.e. a bit pattern that caused the bit slip in the PRBS analyzer 130. Referring again to FIG. 11, in the illustrated embodiment this functionality for the data stored in the first buffer 160$_1$ of the first data lane is supported by a slip detector 440, which cooperates with the error data parser 101 and the PRBS generator 403 of the first data lane to analyze 'dirty' data segments stored in the first buffer 160$_1$ to verify if these data are cause by a bit slip, and to generate a bit slip corrected PRBS seed. It will be appreciated that a similar bit slip detection and correction mechanism may be provided within EPA 18 for every data lane.

Figure 16:
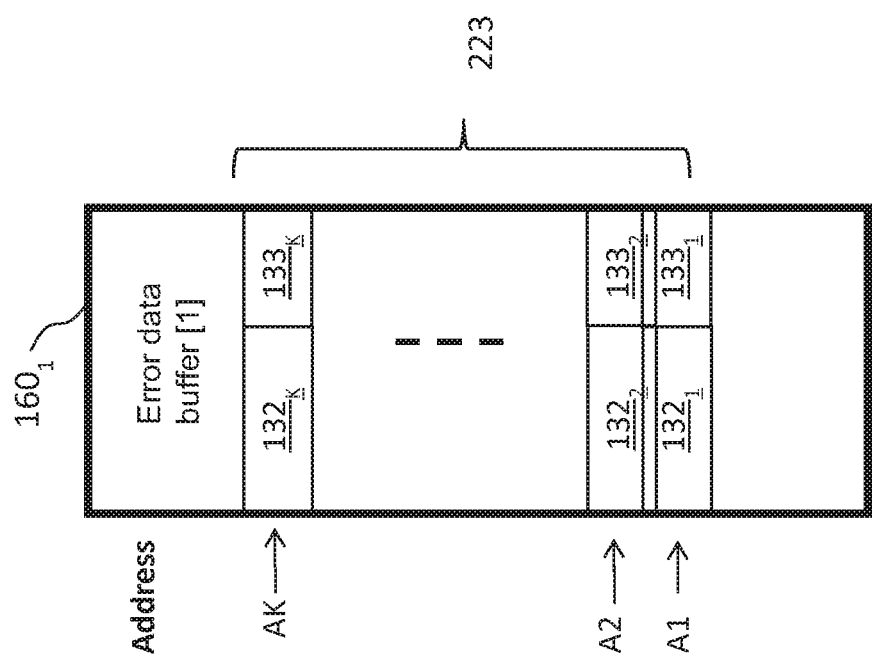
FIG. 16 is a schematic diagram showing a 'dirty' data segment saved in a raw error data buffer.
Figure 17:
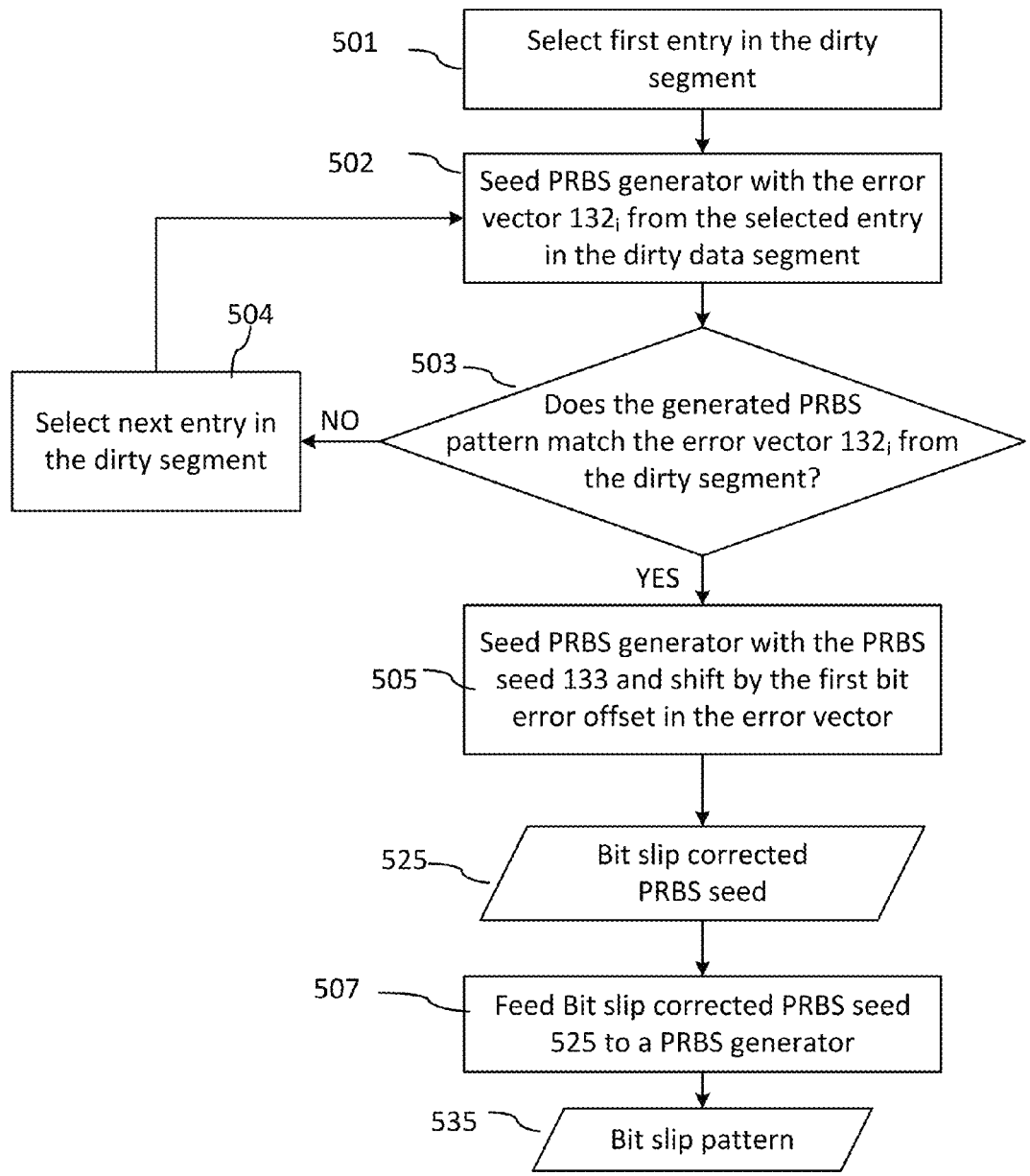
FIG. 17 is a flowchart of a method for verifying a bit slip and identifying a bit slip causing bit pattern.

The bit slip detection functionality of EPA 18 will now be described with reference to FIG. 17 showing main steps of the method for bit slip detection, and further with reference to FIG. 16 illustrating the dirty data segment 223 stored in the error data buffer 160$_1$, with the first entry in the dirty data stored at address 'A1' and the last entry stored at address 'AK'.

The method starts at step 501, wherein the first entry in the dirty data segment 223 is selected by the parser 401. In this step, the error data parser 401 reads the dirty data pointer 141, which points to the address 'A1' of the first entry in the dirty data segment 223. In order to verify that the excess bit errors in the dirty data segment 223 was caused by a bit slip, at step 502 a bit pattern of a suitable length from the error vector 132$_1$ of the first entry in the dirty segment 223 at address A1 is used as the seed of the PRBS generator 403. The PRBS bit pattern generated by this generator is sent to the bit slip detector 440, which compares it to the error vector bit pattern 132$_1$ stored in the dirty segment 223. Since the generated PRBS is in phase with the error vector 132$_1$, the comparison may start with the portion of the error vector 132$_1$ which was used to seed the PRBS generator. The actual number of bits compared should be at least as long as the PRBS seed, i.e. as long as the degree of the polynomial of the PRBS generator. However, more bits can be compared for added reliability, since the "dirty" data may not be caused by a slip but by a long error burst. In one embodiment, all bits till the end of the "dirty" segment 223 are compared. If both patterns match at step 503, then the dirty data entry at the address A1 was caused by a bit slip, and the error data buffer entry {132$_1$, 133$_1$} stored as the first entry A1 of the dirty data segment 223 is used to recover the bit level seed 185 of the bit pattern causing the bit slip. This is done by loading in step 505 the PRBS generator 403 with the stored PRBS seed 133$_1$ and shifting it by the number of bits that is equal to the offset of the first bit error within the error vector 132$_1$, which results in the generation of a bit-level bit slip corrected PRBS seed 525. By feeding this bit-level PRBS seed 525 to the PRBS generator 413 in step 507, a bit slip pattern 535 may be generated.

If in step 503 the patterns do not match, at step 504 a next entry in the dirty data segment 223 is selected, and the check is repeated with the 2nd error vector 132$_2$ from the second entry in the dirty data segment 223, and so on until the end 'AK' of the dirty data segment 223 is reached. This mechanism accounts for multi-bit slips. If no matching patterns can be found until the end of the segment 223 is reached, it is assumed that the dirty data was not caused by a slip. If matching patterns are found in step 503 a bit slip is assumed.

By going through all dirty data segments, a bit level PRBS seed list similar to the list 183 in the aforedescribed bit error pattern analysis is build. This list contains one entry for every bit slip. Further processing and analysis of this list is similar to bit error pattern analysis, and may include identifying top N most frequently encountered bit slip patterns, and generating signal characteristics therefor.

The aforedescribed bit slip verification approach is based upon the PRBS property that, in the case of a bit slip, the bit error pattern, i.e. the pattern of '1's and '0's in the error vector 132, is also a PRBS of the same type as the original PRBS. Therefore, when the PRBS generator is seeded with the bit error pattern from the error vector 132 and the resulting bit sequence generated by the PRBS generator is identical to the bit error pattern stored in the buffer 160, the bit errors are due to a bit slip.

The number of consecutive bits from the error vector 132 that are used to seed the PRBS generator in step 502 is defined by the order of the PRBS generator, or in other words by the width of the PRBS seed. By way of example, for a PRBS31 31 consecutive bits from the error vector 132 have to be used as a PRBS seed in step 502, while for a PRBS7 7 consecutive bits from the error vector 132 have to be used. For an implementation where the width of the error vector 132 is smaller than the width of the PRBS seed, two or more error vectors are concatenated to get these bits.

Bit Slip Word Pattern Analysis (Inter-Lane)

Bit slip word pattern analysis is similar to bit slip bit pattern analysis. However, like with word error pattern analysis described hereinabove, not only the bit level seeds of the analyzed lane wherein the bit slip occurred are generated but also the corresponding time-synchronous bit level seeds of all the other lanes are generated too. The process used is similar to the word pattern analysis described hereinabove. Further processing of the bit slip word pattern analysis is similar to the word error pattern analysis as described hereinbelow.

Characterizing Bit Error Patterns, Bit Slip Patterns, Word Error Patterns and Bit Slip Word Error Patterns In one embodiment, EPA 18 includes a bit slip & bit error pattern characterization module (BSBEPC) module 450, which is also referred to herein simply as a characterization module 450 and which includes logic for determining one or more signal characteristics for the bit error & slip patterns and the word error & slip patterns. Examples of the signal characteristics that can be computed include baseline wander, transition density, and transition density wander. The baseline wander represent a variation of a DC component of a signal over time and is obtained by computing a running average of a bit pattern with an averaging window several bits wide. The transition density is an average number of bit transitions between logical '1' and '0' for a window of P>1 bits wide; it can be computed by dividing the number of bit transition that occur over a window of P bits wide by the number of bits in the window P. The transition density wander, which is also referred to as clock wander, is a low pass filtered deviation of the transition density from a long time average.

Accordingly, embodiments of the characterization module 450 may include one or more of the following modules: a baseline wander computing module 431 which computes the baseline wander characteristic for a bit error pattern provided thereto from a PRBS generator 413 and a transition density wander computing module 431 for a bit error pattern, or a bit slip pattern, or a word error pattern or a word bit slip pattern provided thereto from one or more PRBS generators 413. Methods and algorithms for computing the transition density, transition density wander and baseline wander from a given bit pattern are known in the art and are described, for example, in a publication of the Optical Internetworking Forum (OIF) "CEI Short Stress Patterns White Paper", by Pete Anslow et al, which is available from the OIF website "oiforum.com", which is included herein by reference.

Figure 18:
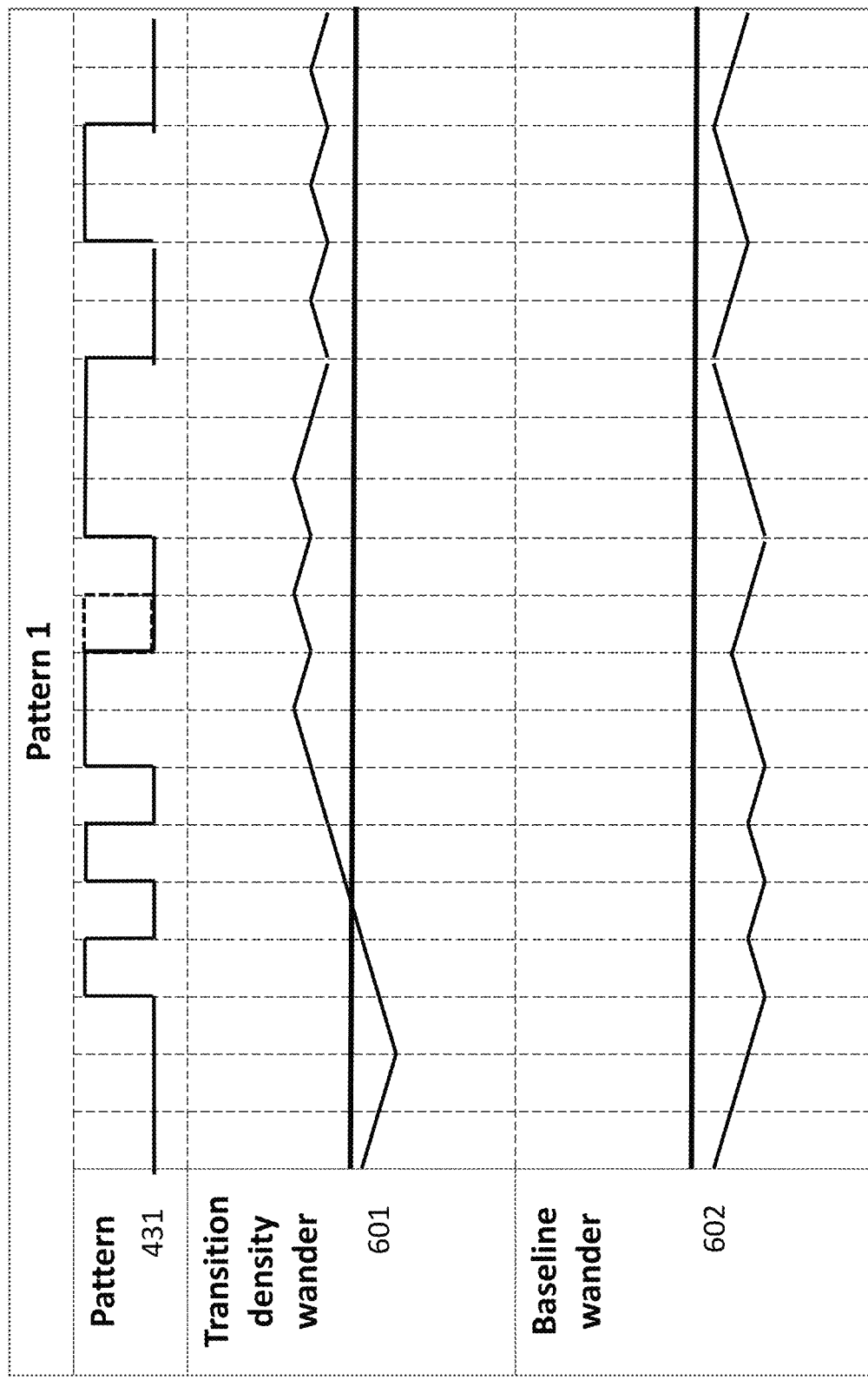
FIG. 18 is an exemplary display view showing transition density wander and baseline wander curves for a selected bit error pattern.

With reference to FIG. 18, in one embodiment EPA 18 is configured to display the transition density wander curve 601 and a baseline wander curve 602 for a selected bit error pattern 431. Similarly, the same curves may also be computed by the characterization module 450 and displayed for a word error pattern 333, a bit slip pattern 535, and a word bit slip pattern.

Figure 19:
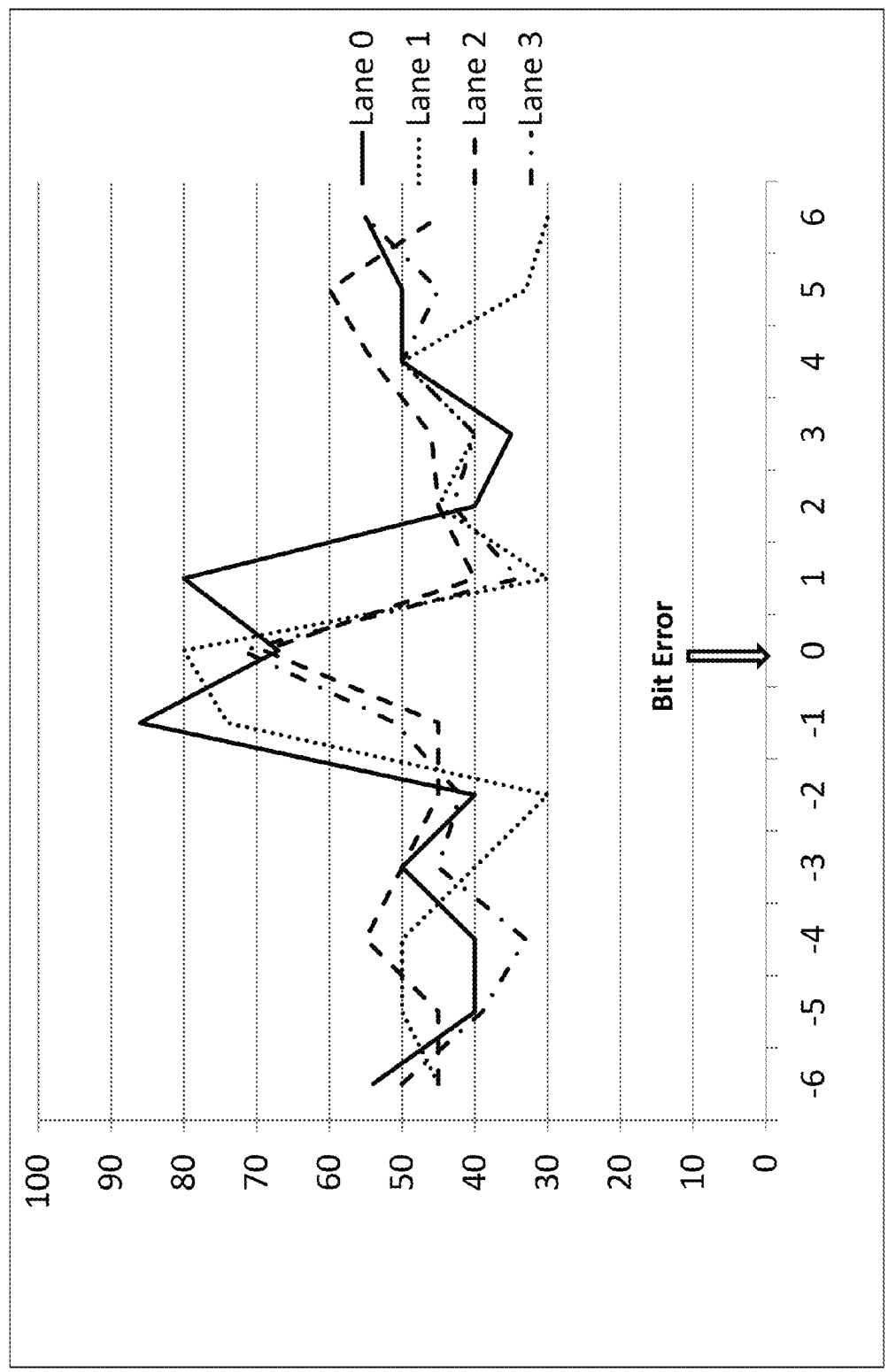
FIG. 19 is a schematic diagram showing transition probability (vertical axis) versus bit error position (horizontal axis) for bit patterns in four lanes.

In one embodiment the characterization module 450 may further include logic 433 for computing transition probability versus bit slip or bit error position, which can then displayed to a user. The transition probability is defined as the probability of a lane to transition between '1' and '0' when a bit error occurs. It may be computed, for example by a following method: i) counting the number of transitions between '1' and '0' at the position of the bit error for all bit error patterns of a lane, and then dividing the transition count by the number of error patterns. This is done for the lane in error itself as well as for any other lanes in the link. By repeating this procedure for bit positions in the vicinity of the bit in error, a transition probability curve is obtained for any lane at and in the vicinity of the bit in error. FIG. 19 illustrates an exemplary view of the display of EPA 18 showing four transition probability curves for four data lanes versus the bit error position, which are useful to diagnose errors due to crosstalk or simultaneous switching noise. The presence of a correlation between bit errors in one lane and bit transitions in neighboring lanes indicates a crosstalk between lanes and/or noise due to simultaneous switching. In the shown in FIG. 19 example, the high transition probabilities of all lanes at and near the bit error position points to a simultaneous switching noise or a crosstalk problem. If there was no crosstalk/switching noise involved, the transition probability would be close to 50% for all lanes.

Figure 20:
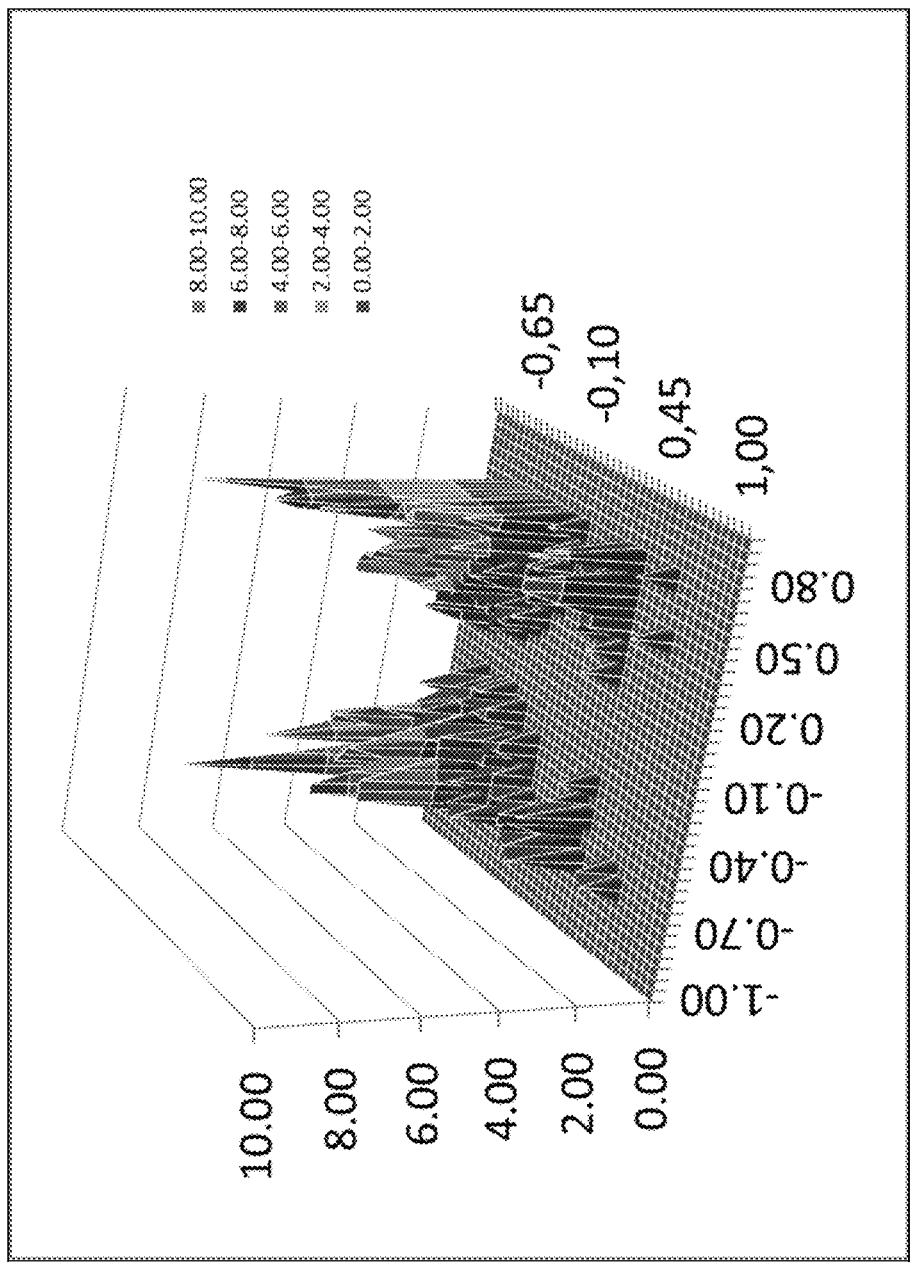
FIG. 20 is an exemplary histogram of bit slip probability versus transition density wander and baseline wander.

In one embodiment, the characterization module 450 may further include logic 434 for generating bit error and bit slip probability histograms versus any of the derived signal characteristics. Examples are histograms for bit error or bit slip probability versus transition density wander, versus baseline wander or versus transition density. FIG. 20 shows an exemplary two-dimensional histogram of bit slip probability versus transition density wander and baseline wander. In the shown example the bit error probability correlates with negative baseline wander, which indicates a baseline wander problem in the DUT.

The aforedescribed method and device for analyzing bit error and bit slip patterns provides an indirect, non-intrusive means to bit error and bit slip diagnosis and analysis, wherein bit and word patterns that are likely to cause errors and bit slips in the receiver are identified and analyzed. The method uses a single or multi-lane bit error rate test set (BERT) which is augmented by an error pattern analyzer. Pseudo random sequences (PRBS) are used as test signals. The method provides a number of advantages over previous approaches, including the following: a) root causes of bit error and bit error slips which occur in the DUT may be identified without the need to tap signals from inside the DUT; b) every error is captured, even if the rate of occurrence of it is very low; c) it is applicable to data links not directly accessible, e.g. links inside a component, and to a number of topologies, e.g. point-to-point, loopback; d) it does not require high bandwidth analog measurement equipment; e) enables to identify which portion of the signal is actually causing errors, as the instrument's BERT receiver is directly detecting the errors; f) it provides error pattern analysis results that can be directly mapped to link features and parameters.

For example, a finding that bit errors correlate with both positive and negative baseline wander peaks, it may signal that the bandwidth of AC-coupling in DUT is too high. If bit errors correlate with positive or negative baseline wander peaks, it may signal that the input to an amplifier in the DUT is incorrectly biased, or a slicer level in the receiver not set to an optimum value. If bit errors occur for single ones/zeros embedded in longer blocks of zeros/ones, i.e. where the transition probability is low, it may signal that there is not enough bandwidth, or the DUT includes a receiver with a too low equalization, or insufficient de-emphasis in a transmitter in the DUT. If bit errors/slips correlate with peaks in the transition density wander, it may signal that the CDR control loop bandwidth is too high, or CDR phase noise is too high. If bit errors correlate with positive or negative transition density wander peaks, it may signal that the CDR sampling phase is not set to optimum value.

The above-described exemplary embodiments are intended to be illustrative in all respects, rather than restrictive, of the present invention. For example, although embodiment of the invention have been described hereinabove with reference to a multi-lane error pattern analyzer, a single-lane error pattern analyzer and method is also within the scope of the present invention. Furthermore, the operation of the error pattern analyzer of the present invention has been described with reference to NRZ signals, it will be appreciated that the method of the present invention is also applicable to other modulation formats such as RZ and PAM-4. Thus the present invention is capable of many variations in detailed implementation that can be derived from the description contained herein by a person skilled in the art. All such variations and modifications are considered to be within the scope and spirit of the present invention as defined by the following claims.

We claim:

1. A method of testing a data link having a multi-lane input port and a multi-lane output port, the method comprising:
   a) providing a first pseudo-random bit sequence (PRBS) and providing a second PRBS synchronously with the first PRBS to the multi-lane input port of the data link;
   b) using a first PRBS analyzer connected to the output port of the data link to detect bit error events in a first received bit sequence, wherein the first received bit sequence corresponds to the first PRBS transmitted over the data link, and using a second PRBS analyzer synchronized with the first PRBS analyzer to detect bit errors in a second bit sequence received at the multi-lane output port of the data link, wherein the second bit sequence corresponds to the second PRBS transmitted over the data link;
   c) for each bit error event detected by the first PRBS analyzer in at least a portion of the first received bit sequence and for each bit error event detected by the second PRBS analyzer in at least a portion of the second received bit sequence, writing bit error information into an error buffer, wherein the bit error information comprises PRBS analyzer state information corresponding to the detected bit error event, and generating, for each detected bit error event, a word error pattern identifier, said word error pattern identifier identifying an inter-lane word that is composed of bits from each of the first and second received bit sequences that are associated with the detected bit error event;
   d) using an error pattern analyzer to read the bit error information from the error buffer, to associate detected errors with specific bit patterns, and to generate therefrom error pattern analysis information that is indicative of a cause of the detected bit errors; and,
   e) providing the error pattern analysis information to a user.

2. The method of claim 1, wherein the bit error information comprises an error vector and a PRBS seed data corresponding to said error vector.

3. The method of claim 2, wherein step (d) comprises generating, for each bit error in the error vector, an error bit pattern identifier, said error bit pattern identifier uniquely identifying an error bit pattern corresponding to a segment of the first received bit sequence where the bit error occurred.

4. The method of claim 3, wherein step (d) further comprises generating a list of top N most frequently encountered error bit pattern identifiers, wherein N is an integer equal or greater than 1.

5. The method of claim 4, wherein step (d) further comprises generating an error bit pattern corresponding to at least one of the top N most frequently encountered error bit pattern identifiers.

6. The method of claim 5, wherein generating error pattern analysis information in step (d) comprises deriving a signal characteristic from the error bit pattern, wherein the signal characteristic comprises one of a baseline wander, a transition density, and a transition density wander.

7. The method of claim 1, wherein step (c) comprises
   c1) counting the number of bit errors or detected bit error events in each consecutive threshold interval of the received bit sequence, each threshold interval being of a same pre-defined length or duration;
   c2) once a first threshold interval with the number of bit errors or detected bit error events exceeding a threshold value is detected, identifying said first threshold interval as a first dirty-data interval and sending a resynchronization trigger signal to the PRBS analyzer; and,
   c3) repeating step c2) for each consecutive threshold interval after the first dirty-data interval until a first threshold interval with the number of bit errors below the threshold value is detected.

8. The method of claim 7, further comprising stopping the writing of the bit error information in the bit error buffer once the first dirty-data interval is detected, and resuming the writing of the bit error information in the bit error buffer once the first interval with the number of bit errors below the threshold value is detected.

9. The method of claim 7, wherein step c2) comprises:
   verifying that the first dirty-data interval is due to a bit slip in the PRBS analyzer, and generating a bit slip pattern using bit error information for the first dirty-data interval, wherein the bit slip pattern corresponds to a bit pattern in the first received bit sequence where the bit slip occurred.

10. The method of claim 9 wherein the bit error information comprises an error vector and a PRBS seed data corresponding to said error vector, the method further comprising:
    f) using one or more bit sequences from one or more error vectors from the first dirty-data interval as a test PRBS seed, and seeding a PRBS generator with the test PRBS seed to generate a test PRBS pattern;
    g) verifying that the test PRBS pattern generated in step f) matches a bit pattern of the one or more error vector of the first dirty-data interval;
    h) if a match is detected in step g), generating the bit slip PRBS seed using the error vector and the PRBS seed data corresponding to said error vector from the first dirty-data interval, and generating the bit slip pattern using the bit slip PRBS seed.

11. The method of claim 1, wherein the word error pattern identifier comprises a bit-level PRBS seed for each of the first and second received bit sequences that is synchronous with the bit error, each bit-level PRBS seed uniquely identifying a bit pattern corresponding to a segment of the first or second received bit sequence that is synchronous with the bit error.

12. The method of claim 1, further comprising generating a list of N most frequently encountered word error pattern identifiers.

13. The method of claim 11, wherein step (d) comprises deriving a signal characteristic for the bit patterns in the first and second received bit sequences that are synchronous with the bit error, wherein the signal characteristics comprise one of a baseline wander, a transition density, and a transition density wander.

14. The method of claim 13, wherein the error pattern analysis information comprises at least one of: a bit error probability histogram versus the signal characteristic, a bit slip probability histogram versus the signal characteristic, and the transition probability versus a bit error or bit slip position.

15. The method of claim 1, wherein the error pattern analysis information comprises at least one of: a list of top N bit error patterns, a list of top N bit slip error causing patterns, and a list of top N most frequently encountered word error patterns.

16. A bit error pattern tester for testing digital signal transmission through a data link, comprising:
   a pseudo-random bit sequence (PRBS) generator for synchronously feeding PRBS signals into a multi-lane input port of the data link;
   PRBS analyzers for detecting bit errors in received bit sequences, wherein the received bit sequences correspond to the PRBS signals received from a multi-lane output port of the data link after transmission over the data link;
   an error data buffer;
   an error data generator operatively connected to the PRBS analyzers for receiving therefrom bit error information for each detected bit error event, and for writing the bit error information into the error buffer, and for generating, for each detected bit error event, a word error pattern identifier, said word error pattern identifier identifying an inter-lane word that is comprised of bits from the received bit sequences that are associated with the detected bit error event;
   an error pattern analyzer that is operatively connected to the error data buffer and is configured to associate detected errors with specific bit patterns based on the bit error information saved in the error data buffer, and to generate bit error pattern analysis information that is indicative of a cause of the detected bit errors; and,
   an output device for providing the bit error pattern analysis information to the user.

17. The bit error pattern tester of claim 16, comprising:
   wherein the bit error information comprises an error vector and a PRBS seed data corresponding to said error vector.

18. The method of claim 17, wherein the error pattern analyzer is to generate, for each bit error in the error vector, an error bit pattern identifier, said error bit pattern identifier uniquely identifying an error bit pattern corresponding to a segment of the bit sequence where the bit error occurred.

19. The bit error pattern tester of claim 16, wherein the error pattern analyzer is to generate a list of top N most frequently encountered bit error patterns, wherein N is an integer equal to or greater than 1.

* * * * *